US012666691B2

(12) United States Patent
Noh et al.

(10) Patent No.: US 12,666,691 B2
(45) Date of Patent: Jun. 23, 2026

(54) SEMICONDUCTOR DEVICE INCLUDING AN INTERNAL SPACER

(71) Applicant: Samsung Electronics Co., Ltd., Suwon-si (KR)

(72) Inventors: Chang Woo Noh, Hwaseong-si (KR); Myung Gil Kang, Suwon-si (KR); Tae Young Kim, Hwaseong-si (KR); Geum Jong Bae, Suwon-si (KR); Keun Hwi Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 429 days.

(21) Appl. No.: 17/229,045

(22) Filed: Apr. 13, 2021

(65) Prior Publication Data

US 2022/0085161 A1 Mar. 17, 2022

(30) Foreign Application Priority Data

Sep. 11, 2020 (KR) ........................ 10-2020-0116597

(51) Int. Cl.
H10D 64/68 (2025.01)
H10D 30/67 (2025.01)
(Continued)

(52) U.S. Cl.
CPC ......... H10D 64/68 (2025.01); H10D 30/6735 (2025.01); H10D 30/6757 (2025.01); H10D 62/121 (2025.01); H10D 64/018 (2025.01)

(58) Field of Classification Search
CPC ................. H01L 29/51; H01L 29/0673; H01L 29/42392; H01L 29/66553;
(Continued)

(56) References Cited

U.S. PATENT DOCUMENTS 9,704,863 B1    7/2017  Cheng et al.
9,899,416 B2    2/2018  Kim et al.
(Continued)

FOREIGN PATENT DOCUMENTS

KR          100481209 B1    4/2005
KR    10-2017-0082302 A    7/2017
(Continued)

OTHER PUBLICATIONS

German Office Action dated Jan. 29, 2024 for corresponding German Patent Application No. 10 2021 115 718.8 and its English-language translation.

(Continued)

*Primary Examiner* — Eva Y Montalvo
*Assistant Examiner* — Zhijun Xu
(74) *Attorney, Agent, or Firm* — HARNESS, DICKEY & PIERCE, P.L.C.

(57) ABSTRACT

A semiconductor device includes a substrate, first to sixth nanowires extending in a first direction and spaced apart from each other, first to third gate electrodes extending in a second direction and respectively on first to third regions of the substrate, a first interface layer of a first thickness between the first gate electrode and the second nanowire, a second interface layer of a second thickness between the third gate electrode and the sixth nanowire. The first to third gate electrodes respectively may surround the first and second nanowires, third and fourth nanowires, and fifth and sixth nanowires. A first internal spacer may be on a side wall of at least one of the first to third gate electrodes. In the first direction, a first length of the first nanowire may be smaller than a second length of the third nanowire.

15 Claims, 20 Drawing Sheets

(51) Int. Cl.
  *H10D 62/10* (2025.01)
  *H10D 64/01* (2025.01)

(58) Field of Classification Search
  CPC ............. H01L 29/78696; H01L 29/165; H01L
  29/7848; H01L 29/775; H01L 29/0669;
  H01L 27/088; H01L 21/823807; H01L
  21/823828; H01L 21/823857; H01L
  27/092; H01L 21/823412; H01L
  21/823431; H01L 27/0886; H01L
  21/823468; H01L 21/823437; H01L
  21/823462; B82Y 10/00; H10D 64/68;
  H10D 30/6735; H10D 30/6757; H10D
  62/121; H10D 64/018; H10D 30/43;
  H10D 84/0167; H10D 84/0172; H10D
  84/0181; H10D 84/038; H10D 84/85;
  H10D 30/797; H10D 62/822; H10D
  84/0128; H10D 62/119; H10D 84/0158;
  H10D 84/834; H10D 84/0135; H10D
  84/0147; H10D 84/0144; H10D 84/83
  See application file for complete search history.

(56) References Cited

U.S. PATENT DOCUMENTS

| | | | |
|---|---|---|---|
| 9,997,519 B1 | 6/2018 | Bao et al. | |
| 10,312,337 B2 | 6/2019 | Balakrishnan et al. | |
| 10,431,585 B2 | 10/2019 | Yang et al. | |
| 10,566,331 B1 | 2/2020 | Yang et al. | |
| 2016/0315165 A1* | 10/2016 | Lee .................. | H01L 29/42364 |
| 2017/0162651 A1* | 6/2017 | Suk ................... | H01L 29/41775 |
| 2017/0194479 A1* | 7/2017 | Lee ................... | H01L 29/78696 |
| 2017/0200803 A1* | 7/2017 | Lee ....................... | H01L 29/785 |
| 2018/0130905 A1* | 5/2018 | Chung ............... | H01L 29/0676 |
| 2018/0175035 A1 | 6/2018 | Yang et al. | |
| 2018/0175194 A1 | 6/2018 | Reboh et al. | |
| 2020/0013784 A1 | 1/2020 | An et al. | |
| 2020/0075331 A1 | 3/2020 | Noh et al. | |
| 2020/0105929 A1 | 4/2020 | Zhang et al. | |
| 2020/0168742 A1 | 5/2020 | Wang et al. | |
| 2020/0176323 A1 | 6/2020 | Lo et al. | |
| 2020/0219997 A1 | 7/2020 | Mehandru et al. | |
| 2020/0258785 A1 | 8/2020 | Zhang et al. | |
| 2020/0279916 A1 | 9/2020 | Rachmady et al. | |
| 2021/0098588 A1* | 4/2021 | Chung ............. | H01L 29/66553 |

FOREIGN PATENT DOCUMENTS

| | | |
|---|---|---|
| KR | 10-2020-0005419 A | 1/2020 |
| KR | 10-2020-0032940 A | 3/2020 |

OTHER PUBLICATIONS

Korean Notice of Allowance issued on Sep. 4, 2025 for corresponding Korean Patent Application 10-2020-0116597 and its English-language translation.
Korean Office Action dated Jan. 18, 2025 for corresponding Korean Patent Application No. 10-2020-0116597 and its English-language translation.
Taiwanese Office Action dated Dec. 24, 2024 for corresponding Taiwanese Patent Application No. 110130135.

* cited by examiner

<u>NFET</u>

PFET

SEMICONDUCTOR DEVICE INCLUDING AN INTERNAL SPACER

This application claims the benefit of Korean Patent Application No. 10-2020-0116597, filed on Sep. 11, 2020, in the Korean Intellectual Property Office, the disclosure of which is incorporated herein in its entirety by reference.

BACKGROUND

1. Technical Field

The present disclosure relates to a semiconductor device, and more specifically, to a semiconductor device including an MBCFET™ (Multi-Bridge Channel Field Effect Transistor).

2. Description of Related Art

As one of scaling technologies for increasing the density of a semiconductor device, a multi-gate transistor in which a fin or nanowire-shaped silicon body is formed on a substrate and a gate is formed on a surface of the silicon body was proposed.

Since such a multi gate transistor utilizes three-dimensional channels, scaling easily may be performed. Further, even if a gate length of the multi gate transistor is not increased, current control capability can be improved. Furthermore, it is possible to effectively limit and/or suppress a SCE (short channel effect) in which potential of a channel region is affected by the drain voltage.

SUMMARY

Aspects of the present disclosure provide a semiconductor device that effectively controls capacitance of each of a plurality of elements by combining the presence or absence of an internal spacer for each of the plurality of elements.

According to an example embodiment of the present disclosure, a semiconductor device may include a substrate in including a first region, a second region, and a third region; a first nanowire and second nanowire, which are sequentially spaced apart from each other and stacked on the first region of the substrate, the first nanowire and the second nanowire each extending in a first direction; a third nanowire and a fourth nanowire, which are sequentially spaced apart from each other and stacked on the second region of the substrate, the third nanowire and the fourth nanowire each extending in the first direction; a fifth nanowire and a sixth nanowire, which are sequentially spaced apart from each other and stacked on the third region of the substrate, the fifth nanowire and the sixth nanowire each extending in the first direction; a first gate electrode surrounding the first nanowire and the second nanowire, the first gate electrode extending in a second direction different from the first direction; a second gate electrode surrounding the third nanowire and the fourth nanowire, the second gate electrode extending in the second direction; a third gate electrode surrounding the fifth nanowire and the sixth nanowire, the third gate electrode extending in the second direction; a first interface layer between the first gate electrode and the second nanowire, the first interface layer having a first thickness; a second interface layer between the third gate electrode and the sixth nanowire, the second interface layer having a second thickness greater than the first thickness; and a first internal spacer on a side wall of at least one of the first gate electrode, the second gate electrode, and the third gate electrode. A first length of the first nanowire in the first direction may be smaller than a second length of the third nanowire in the first direction.

According to an example embodiment of the present disclosure, a semiconductor device may include a substrate including a first region, a second region, and a third region that are NMOS regions; a first plurality of nanowires on the first region of the substrate, each extending in a first direction; a second plurality of nanowires on the second region of the substrate, each extending in the first direction; a third plurality of nanowires on the third region of the substrate, each extending in the first direction; a first gate electrode surrounding the first plurality of nanowires and extending in a second direction different from the first direction; a second gate electrode surrounding the second plurality of nanowires and extending in the second direction; a third gate electrode surrounding the third plurality of nanowires and extending in the second direction; a first interface layer between the first gate electrode and the first plurality of nanowires, the first interface layer having a first thickness; a second interface layer between the third gate electrode and the third plurality of nanowires, the second interface layer having a second thickness greater than the first thickness; a first gate insulation layer between the first gate electrode and the first interface layer; a second gate insulation layer between the third gate electrode and the second interface layer; and a first internal spacer. The first internal spacer may be at least one of between the first plurality of nanowires, between the second plurality of nanowires, and between the third plurality of nanowires. A first length of the first plurality of nanowires in the first direction may be smaller than a second length of the second plurality of nanowires in the first direction.

According to an example embodiment of the present disclosure, a semiconductor device may include a substrate, the substrate including a first region, a second region, and a third region as a NMOS region, and the substrate including a fourth region, a fifth region, and a sixth region as a PMOS region; a first plurality of nanowires on the first region of the substrate; a second plurality of nanowires on the second region of the substrate; a third plurality of nanowires on the third region of the substrate; a fourth plurality of nanowires on the fourth region of the substrate; a fifth plurality of nanowires on the fifth region of the substrate; a sixth plurality of nanowires on the sixth region of the substrate; a first gate electrode surrounding each of the first plurality of nanowires; a second gate electrode surrounding each of the second plurality of nanowires; a third gate electrode surrounding each of the third plurality of nanowires; a fourth gate electrode surrounding each of the fourth plurality of nanowires; a fifth gate electrode surrounding each of the fifth plurality of nanowires; a sixth gate electrode surrounding each of the sixth plurality of nanowires; a first interface layer between the first gate electrode and the first plurality of nanowires, the first interface layer having a first thickness; a second interface layer between the third gate electrode and the third plurality of nanowires, the second interface layer having a second thickness greater than the first thickness; a third interface layer between the fourth gate electrode and the fourth plurality of nanowires, the third interface layer having a third thickness; a fourth interface layer between the fifth gate electrode and the fifth plurality of nanowires, the fourth interface layer having a fourth thickness greater than the third thickness; a first internal spacer on a side wall of at least one of the first gate electrode, the second gate electrode, and the third gate electrode; and a second internal spacer on a side wall of at least one of the fourth gate electrode, the fifth gate electrode, and the sixth gate electrode. A first length of the first plurality of nanowires in a first direction may be smaller than a second length of the second plurality of nanowires in the first direction. A third length of the fourth plurality of nanowires in the first direction may be smaller than a fourth length of the fifth plurality of nanowires in the first direction.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof referring to the attached drawings, in which.

DETAILED DESCRIPTION

Hereinafter, a semiconductor device according to some embodiments of the present disclosure will be explained referring to FIGS. 1 to 4.

Figure 1:
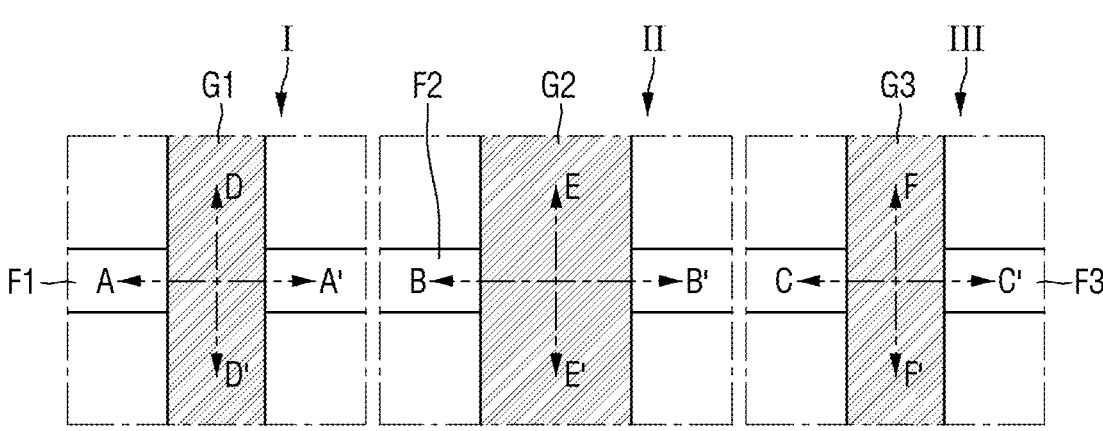
FIG. 1 is a schematic layout diagram for explaining a semiconductor device according to some embodiments of the present disclosure.
Figure 1:
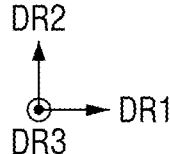
Figure 2:
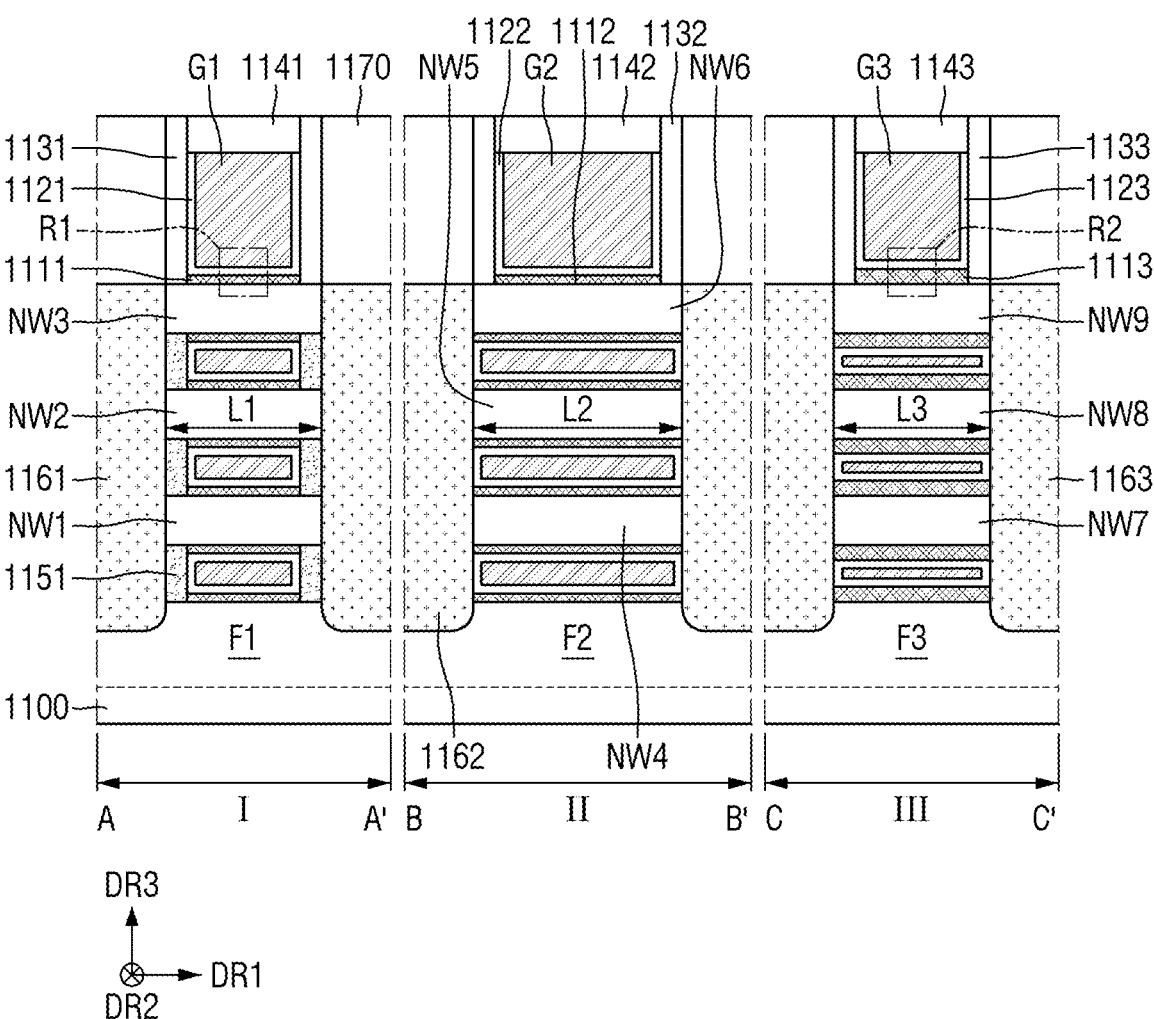
FIG. 2 is a cross-sectional view taken along each of lines A-A', B-B', and C-C' of FIG. 1.
Figure 3:
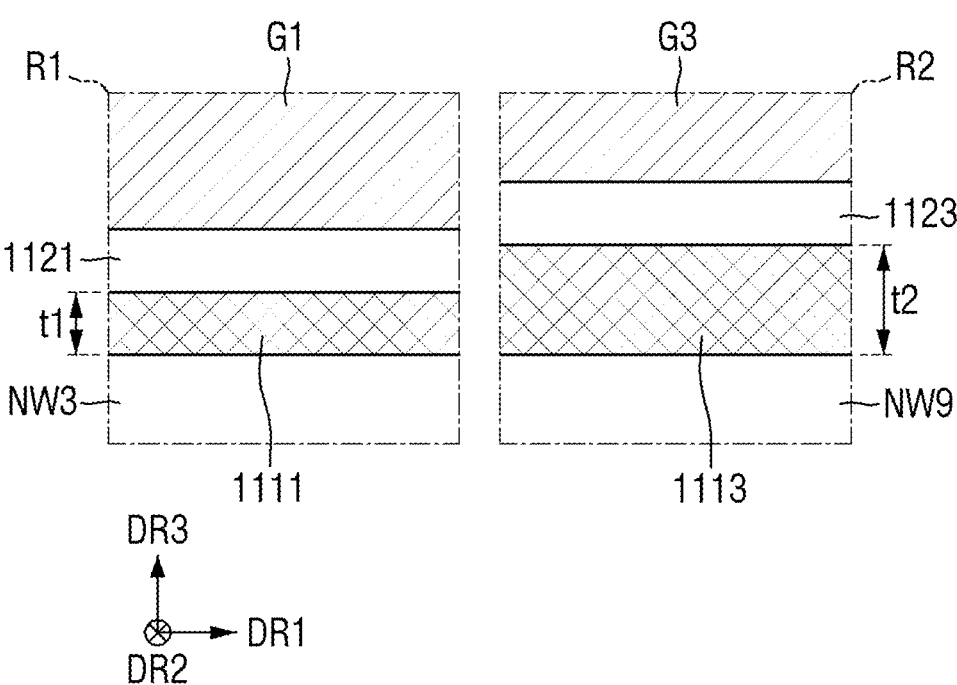
FIG. 3 is an enlarged view of a region R1 and a region R2 of FIG. 2, respectively.
Figure 4:
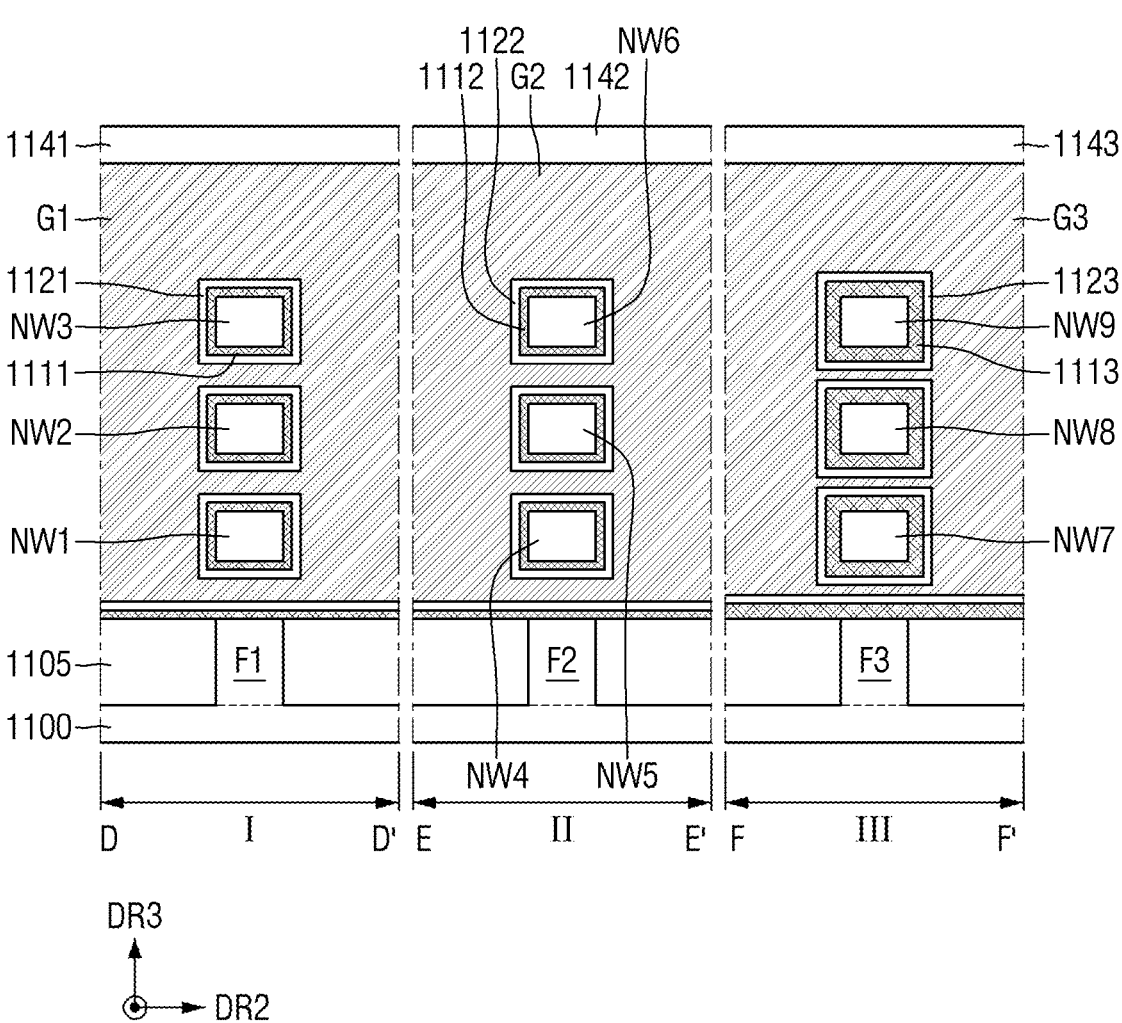
FIG. 4 is a cross-sectional view taken along each of lines D-D', E-E' and F-F' of FIG.

FIG. 1 is a schematic layout diagram for explaining a semiconductor device according to some embodiments of the present disclosure. FIG. 2 is a cross-sectional view taken along each of lines A-A', B-B', and C-C' of FIG. 1. FIG. 3 is an enlarged view of each of a region R1 and a region R2 of FIG. 2. FIG. 4 is a cross-sectional view taken along each of lines D-D', E-E' and F-F' of FIG. 1.

Referring to FIGS. 1 to 4, the semiconductor device according to some embodiments of the present disclosure includes a substrate 1100, a field insulation layer 1105, first to third active patterns F1, F2 and F3, first to ninth nanowires NW1 to NW9, first to third gate electrodes G1, G2 and G3, first to third interface layers 1111, 1112 and 1113, first to third gate insulation layers 1121, 1122 and 1123, first to third external spacers 1131, 1132 and 1133, first to third capping patterns 1141, 1142 and 1143, a first internal spacer 1151, first to third source/drain regions 1161, 1162 and 1163, and an interlayer insulation layer 1170.

The substrate 1100 may be bulk silicon or SOI (silicon-on-insulator). In contrast, although the substrate 1100 may be a silicon substrate, or may include other substances such as silicon germanium, SGOI (silicon germanium on insulator), indium antimonide, lead tellurium compounds, indium arsenide, indium phosphide, gallium arsenide or gallium antimonide, the present disclosure is not limited thereto.

A first region I in which a first active pattern F1 is formed, a second region II in which a second active pattern F2 is formed, and a third region III in which a third active pattern F3 is formed may be defined on the substrate 1100. For example, each of the first to third regions I, II and III may be an NMOS region. A NFET (N-type Fin Field Effect Transistor) may be formed on the first to third regions I, II and III of the substrate 1100.

Different elements may be formed on each of the first to third regions I, II and III of the substrate 1100. For example, a NMOS region of a SRAM element or a NMOS region of a standard gate short channel (SG SC) element may be formed on the first region I of the substrate 1100. For example, an NMOS region of a standard gate long channel (SG LC) element may be formed on the second region II of the substrate 1100. For example, an NMOS region of a thick oxide gate (EG) element may be formed on the third region III of the substrate 1100.

Each of the first to third active patterns F1, F2 and F3 may protrude from the substrate 1100. Each of the first to third active patterns F1, F2 and F3 may extend in a first direction DR1. Although FIG. 1 shows that the first to third active patterns F1, F2 and F3 are arranged in the first direction DR1, this is for convenience of explanation, and the present disclosure is not limited thereto.

Each of the first to third active patterns F1, F2 and F3 may be formed by etching a part of the substrate 1100, and may include am epitaxial layer that is grown from the substrate 1100. Each of the first to third active patterns F1, F2 and F3 may have, for example, a fin-shaped pattern shape. The first to third active patterns F1, F2 and F3 may be separated from each other by an element separation layer.

The field insulation layer 1105 may be disposed on the substrate 1100. The field insulation layer 1105 may be disposed on side walls of each of the first to third active patterns F1, F2 and F3 over the substrate 1100.

A first plurality of nanowires NW1, NW2 and NW3 may be disposed on the first region I of the substrate 1100. The first plurality of nanowires NW1, NW2 and NW3 may be disposed on the first active pattern F1. A second plurality of nanowires NW4, NW5 and NW6 may be disposed on the second region II of the substrate 1100. The second plurality of nanowires NW4, NW5 and NW6 may be disposed on the second active pattern F2. A third plurality of nanowires NW7, NW8 and NW9 may be disposed on the third region III of the substrate 1100. The third plurality of nanowires NW7, NW8 and NW9 may be disposed on the third active pattern F3.

Although FIG. 2 shows that each of the first plurality of nanowires NW1, NW2 and NW3, the second plurality of nanowires NW4, NW5 and NW6, and the third plurality of nanowires NW7, NW8 and NW9 includes three nanowires, this is for convenience of explanation, and the number of nanowires is not limited thereto. Hereinafter, an example in which the first plurality of nanowires NW1, NW2 and NW3, the second plurality of nanowires NW4, NW5 and NW6 and the third plurality of nanowires NW7, NW8 and NW9 each include two nanowires will be explained.

The first plurality of nanowires NW1, NW2 and NW3 may include a first nanowire NW1, a second nanowire NW2 and a third nanowire NW3 sequentially spaced apart from each other and stacked on the first active pattern F1 in a third direction DR3 which is a vertical direction. The second plurality of nanowires NW4, NW5 and NW6 may include a fourth nanowire NW4, a fifth nanowire NW5 and a sixth nanowire NW6 sequentially spaced apart from each other and stacked on the second active pattern F2 in a third direction DR3. The third plurality of nanowires NW7, NW8 and NW9 may include a seventh nanowire NW7, an eighth nanowire NW8 and a ninth nanowire NW9 sequentially spaced apart from each other and stacked on the third active pattern F3 in the third direction DR3. Each of the first to ninth nanowires NW1 to NW9 may extend in the first direction DR1.

Each of the first plurality of nanowires NW1, NW2 and NW3 may have a first length L1 in the first direction DR1. Each of the second plurality of nanowires NW4, NW5 and NW6 may have a second length L2 in the first direction DR1 that is larger than the first length L1. Each of the third plurality of nanowires NW7, NW8 and NW9 may have a third length L3 in the first direction DR1 that is smaller than the second length L2. For example, the third length L3 may be the same as the first length L1. However, the present disclosure is not limited thereto.

Each of the first length L1 and the third length L3 may be, for example, 5 nm to 20 nm. The second length L2 may be, for example, 30 nm to 300 nm.

The first gate electrode G1 may be disposed on the first region I of the substrate 1100. The second gate electrode G2 may be disposed on the second region II of the substrate 1100. The third gate electrode G3 may be disposed on the third region III of the substrate 1100. Each of the first to third gate electrodes G1, G2 and G3 may extend in a second direction DR2 different from the first direction DR1.

The first gate electrode G1 may surround each of the first plurality of nanowires NW1, NW2 and NW3. The second gate electrode G2 may surround each of the second plurality of nanowires NW4, NW5 and NW6. The third gate electrode G3 may surround each of the third plurality of nanowires NW7, NW8 and NW9.

A width of the second gate electrode G2 in the first direction DR1 may be greater than a width of the first gate electrode G1 in the first direction DR1. Further, the width of the second gate electrode G2 in the first direction DR1 may be greater than a width of the third gate electrode G3 in the first direction DR1. For example, although the width of the first gate electrode G1 in the first direction DR1 may be the same as the width of the third gate electrode G3 in the first direction DR1, the present disclosure is not limited thereto.

Each of the first to third gate electrodes G1, G2 and G3 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Each of the first to third gate electrodes G1, G2 and G3 may include a conductive metal oxide, a conductive metal oxide nitride, and the like, and also may include an oxidized form of the above-mentioned substances.

A first interface layer 1111 may be disposed between the first gate electrode G1 and the first plurality of nanowires NW1, NW2 and NW3. The first interface layer 1111 may also be disposed between the field insulation layer 1105 and the first gate electrode G1, and between the first active pattern F1 and the first gate electrode G1.

A second interface layer 1112 may be disposed between the second gate electrode G2 and the second plurality of nanowires NW4, NW5 and NW6. The second interface layer 1112 may also be disposed between the field insulation layer 1105 and the second gate electrode G2, and between the second active pattern F2 and the second gate electrode G2.

A third interface layer 1113 may be disposed between the third gate electrode G3 and the third plurality of nanowires NW7, NW8 and NW9. The third interface layer 1113 may also be disposed between the field insulation layer 1105 and the third gate electrode G3, and between the third active pattern F3 and the third gate electrode G3.

A second thickness t2 of the third interface layer 1113 may be greater than a first thickness t1 of the first interface layer 1111. Also, the second thickness t2 of the third interface layer 1113 may be greater than the thickness of the second interface layer 1112. For example, the first thickness t1 of the first interface layer 1111 may be the same as the thickness of the second interface layer 1112. However, the present disclosure is not limited thereto.

Each of the first thickness t1 and the second interface layer 1112 of the first interface layer 1111 may be, for example, 0.2 nm to 2 nm. The second thickness t2 of the third interface layer 1113 may be, for example, 2.5 nm to 4.5 nm.

Although each of the first to third interface layers 1111, 1112 and 1113 may include, for example, silicon oxide, the present disclosure is not limited thereto.

The first gate insulation layer 1121 may be disposed between the first gate electrode G1 and the first interface layer 1111. The first gate insulation layer 1121 may also be disposed between the first gate electrode G1 and the first external spacer 1131, and between the first gate electrode G1 and the first internal spacer 1151.

The second gate insulation layer 1122 may be disposed between the second gate electrode G2 and the second interface layer 1112. The second gate insulation layer 1122 may also be disposed between the second gate electrode G2 and the second external spacer 1132, and between the second gate electrode G2 and a second source/drain region 1162.

The third gate insulation layer 1123 may be disposed between the third gate electrode G3 and the third interface layer 1113. The third gate insulation layer 1123 may also be disposed between the third gate electrode G3 and the third external spacer 1133, and between the third gate electrode G3 and a third source/drain region 1163.

Each of the first to third gate insulation layers 1121, 1122 and 1123 may include at least one of silicon oxide, silicon oxynitride, silicon nitride, or a high-k substance having a higher dielectric constant than silicon oxide. The high-k substance may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

A first capping pattern 1141 may be disposed on the uppermost face of the first gate electrode G1 and the uppermost face of the first gate insulation layer 1121. A second capping pattern 1142 may be disposed on the uppermost face of the second gate electrode G2 and the uppermost face of the second gate insulation layer 1122. A third capping pattern 1143 may be disposed on the uppermost face of the third gate electrode G3 and the uppermost face of the third gate insulation layer 1123.

Although FIG. 2 shows that the first capping pattern 1141 is disposed between the inner walls of the first external spacer 1131, the second capping pattern 1142 is disposed between the inner walls of the second external spacer 1132, and the third capping pattern 1143 is disposed between the inner walls of the third external spacer 1133, the present disclosure is not limited thereto. In some other embodiments, the first capping pattern 1141 may be disposed on the upper face of the first external spacer 1131, the second capping pattern 1142 may be disposed on the upper face of the second external spacer 1132, and the third capping pattern 1143 may be disposed on the upper face of the third external spacer 1133.

Each of the first to third capping patterns 1141 may include, for example, at least one of silicon nitride (SiN), silicon oxynitride (SiON), silicon oxide (SiO$_2$), silicon carbonitride (SiCN), silicon oxycarbonitride (SiOCN) and combinations thereof.

The first external spacer 1131 may extend in the second direction DR2 along both side walls of the first gate electrode G1 on the upper face of the third nanowire NW3 and the upper face of the field insulation layer 1105. The first external spacer 1131 may be in contact with the side walls of the first interface layer 1111, the side walls of the first gate insulation layer 1121 and the side walls of the first capping pattern 1141, respectively.

The second external spacer 1132 may extend in the second direction DR2 along both side walls of the second gate electrode G2 on the upper face of the sixth nanowire NW6 and the upper face of the field insulation layer 1105. The second external spacer 1132 may be in contact with the side walls of the second interface layer 1112, the side walls of the second gate insulation layer 1122, and the side walls of the second capping pattern 1142.

The third external spacer 1133 may extend in the second direction DR2 along both side walls of the third gate electrode G3 on the upper face of the ninth nanowire NW9 and the upper face of the field insulation layer 1105. The third external spacer 1133 may be in contact with the side walls of the third interface layer 1113, the side walls of the third gate insulation layer 1123, and the side walls of the third capping pattern 1143.

Each of the first to third external spacers 1131, 1132 and 1133 may include, for example, at least one of silicon nitride (SiN), silicon oxynitride (SiON), silicon oxide (SiO$_2$), silicon carbonitride (SiCN), silicon oxycarbonitride (SiOCN), silicon boronitride (SiBN), silicon oxyboronitride (SiOBN), silicon oxycarbide (SiOC) and combinations thereof.

A first source/drain region 1161 may be disposed on at least one side of the first plurality of nanowires NW1, NW2 and NW3 in the first direction DR1. The first source/drain region 1161 may be in contact with the ends of the first plurality of nanowires NW1, NW2 and NW3 in the first direction DR1.

Although FIG. 2 shows that the upper face of the first source/drain region 1161 is formed on the same plane as the upper face of the third nanowire NW3, the upper face of the second source/drain region 1162 is formed on the same plane as the upper face of the sixth nanowire NW6, and the upper face of the third source/drain region 1163 is formed on the same plane as the upper face of the ninth nanowire NW9, the present disclosure is not limited thereto. In some other embodiments, the upper face of the first source/drain region 1161 may be formed to be higher than the upper face of the third nanowire NW3, the upper face of the second source/drain region 1162 may be formed to be higher than the upper face of the sixth nanowire NW6, and the upper face of the third source/drain region 1163 may be formed to be higher than the upper face of the ninth nanowire NW9. Each of the first to third source/drain regions 1161, 1162 and 1163 may include, for example, silicon (Si) or silicon carbide (SiC).

The first internal spacer 1151 may be disposed between the first active pattern F1 and the first nanowire NW1, between the first nanowire NW1 and the second nanowire NW2, and between the second nanowire NW2 and the third nanowire NW3. The first internal spacer 1151 may be disposed on the side walls of the first gate electrode G1. That is, the first internal spacer 1151 may be disposed between the first gate electrode G1 and the first source/drain region 1161.

An internal spacer is not disposed on the second active pattern F2 and the third active pattern F3. That is, the internal spacer is not disposed between the second plurality of nanowires NW4, NW5 and NW6 and between the third plurality of nanowires NW7, NW8 and NW9.

The first internal spacer 1151 may include, for example, at least one of silicon nitride (SiN), silicon oxynitride (SiON), silicon oxide (SiO$_2$), silicon carbonitride (SiCN), silicon oxycarbonitride (SiOCN), silicon boronitride (SiBN), silicon oxyboronitride (SiOBN), silicon oxycarbide (SiOC) and combinations thereof.

The interlayer insulation layer 1170 may be provided to cover the upper faces of each of the first to third source/drain regions 1161, 1162 and 1163, and the side walls of each of the first to third external spacers 1131, 1132 and 1133, and the upper face of the field insulation layer 1105. The interlayer insulation layer 1170 may include, for example, at least one of silicon oxide, silicon nitride, and silicon oxynitride.

Hereinafter, the semiconductor device according to some other embodiments of the present disclosure will be explained referring to FIG. 5. Differences from the semiconductor devices shown in FIGS. 1 to 4 will be mainly explained.

Figure 5:
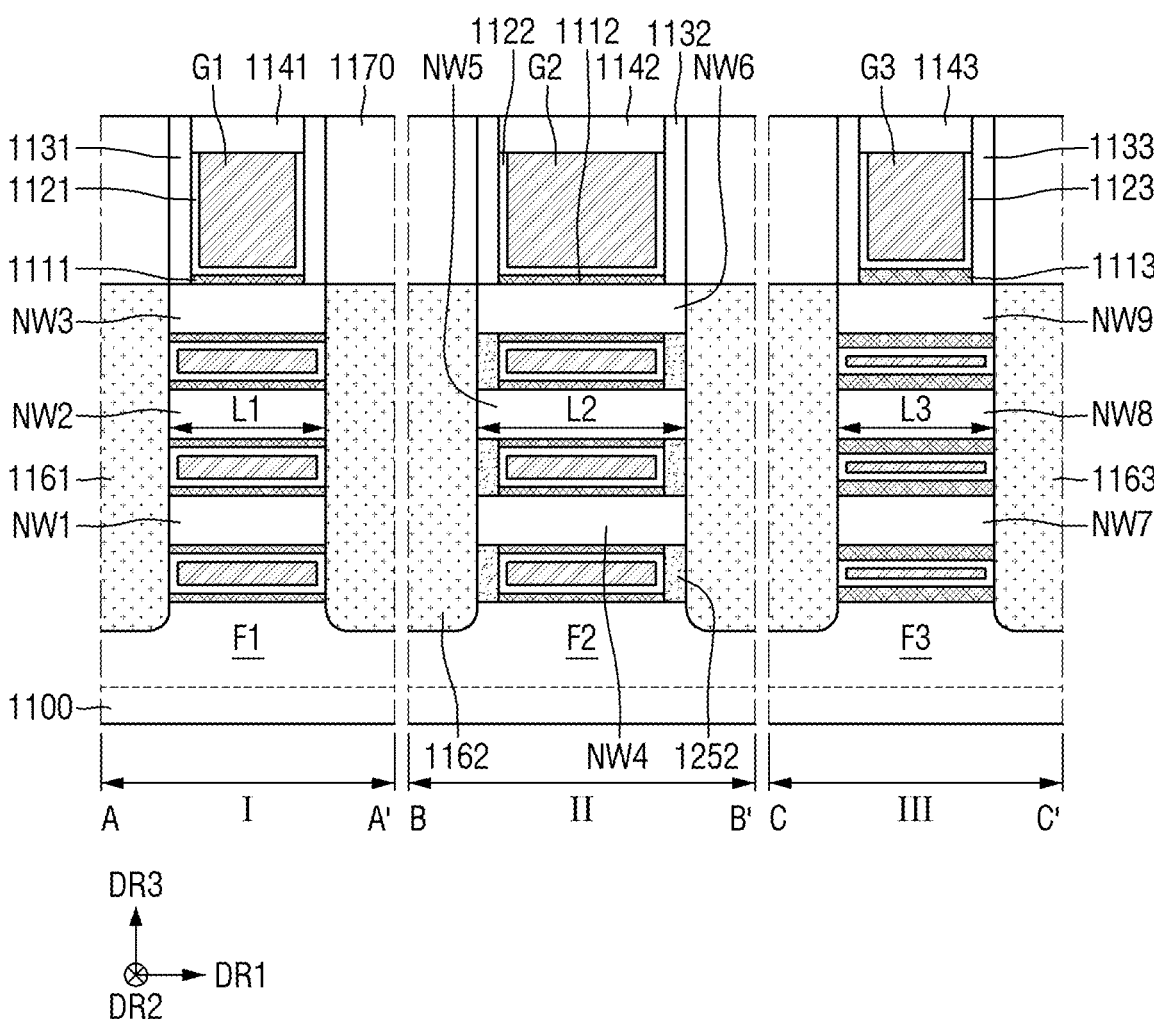
FIG. 5 is a cross-sectional view for explaining a semiconductor device according to some other embodiments of the present disclosure.

FIG. 5 is a cross-sectional view for explaining a semiconductor device according to some other embodiments of the present disclosure.

Referring to FIG. 5, the semiconductor device according to some other embodiments of the present disclosure may have a second internal spacer 1252 disposed on the side walls of the second gate electrode G2.

The second internal spacer 1252 may be disposed between the second active pattern F2 and the fourth nanowire NW4, between the fourth nanowire NW4 and the fifth nanowire NW5, and between the fifth nanowire NW5 and the sixth nanowire NW6. The second internal spacer 1252 may be disposed between the second gate electrode G2 and the second source/drain region 1162.

An internal spacer is not disposed on the first active pattern F1 and the third active pattern F3. That is, the internal spacer is not disposed between the first plurality of nanowires NW1, NW2 and NW3 and between the third plurality of nanowires NW7, NW8 and NW9.

Hereinafter, a semiconductor device according to some other embodiments of the present disclosure will be explained referring to FIG. 6. Differences from the semiconductor devices shown in FIGS. 1 to 4 will be mainly explained.

Figure 6:
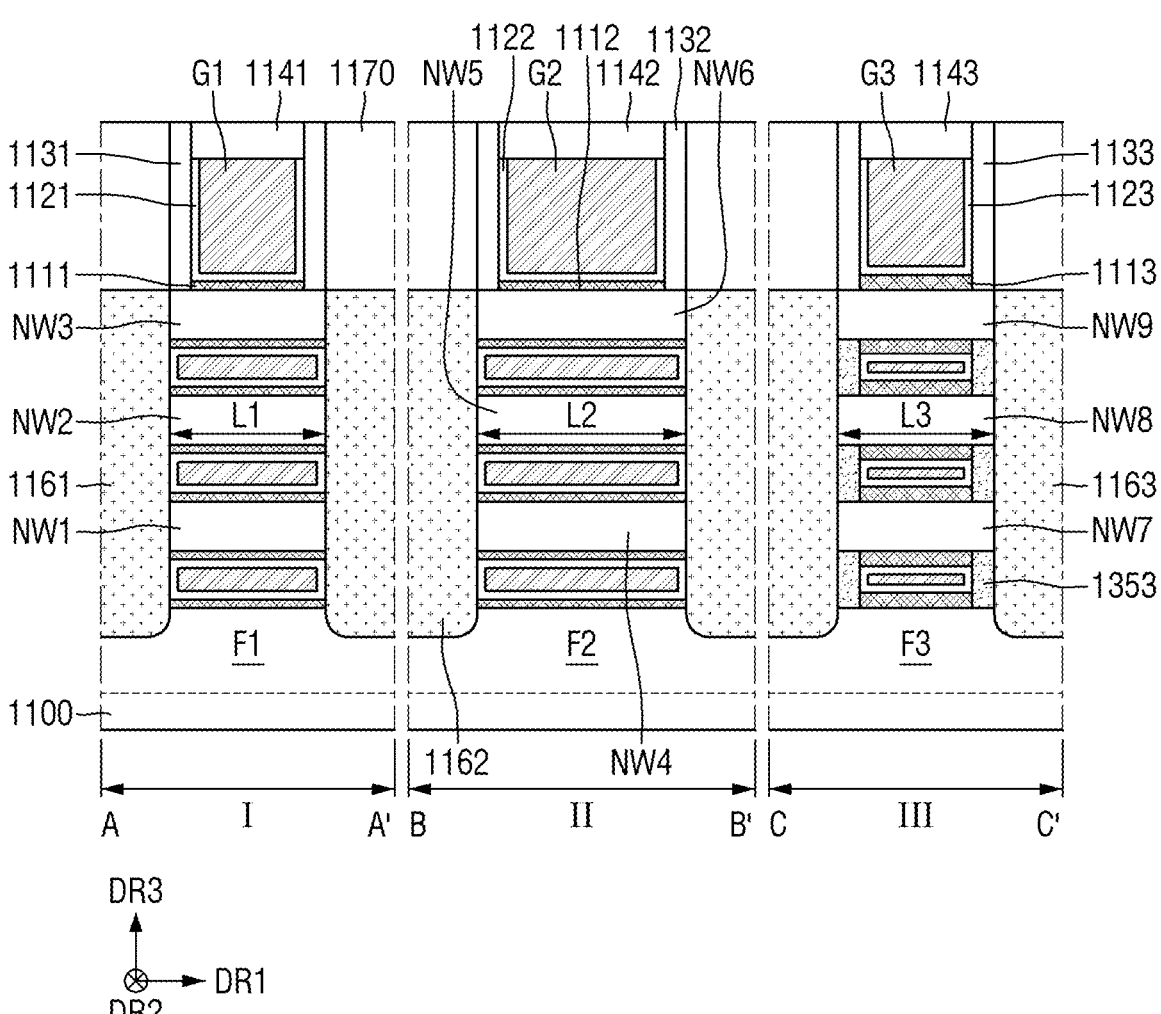
FIG. 6 is a cross-sectional view for explaining a semiconductor device according to some other embodiments of the present disclosure.

FIG. 6 is a cross-sectional view for explaining a semiconductor device according to some other embodiments of the present disclosure.

Referring to FIG. 6, the semiconductor device according to some other embodiment of the present disclosure may have a third internal spacer 1353 disposed on the side walls of the third gate electrode G3.

The third internal spacer 1353 may be disposed between the third active pattern F3 and the seventh nanowire NW7, between the seventh nanowire NW7 and the eighth nanowire NW8, and between the eighth nanowire NW8 and the ninth nanowire NW9. The third internal spacer 1353 may be disposed between the third gate electrode G3 and the third source/drain region 1163.

An internal spacer is not disposed on the first active pattern F1 and the second active pattern F2. That is, the internal spacer is not disposed between the first plurality of nanowires NW1, NW2 and NW3 and between the second plurality of nanowires NW4, NW5 and NW6.

Hereinafter, a semiconductor device according to some other embodiments of the present disclosure will be explained referring to FIG. 7. Differences from the semiconductor devices shown in FIGS. 1 to 4 will be mainly explained.

Figure 7:
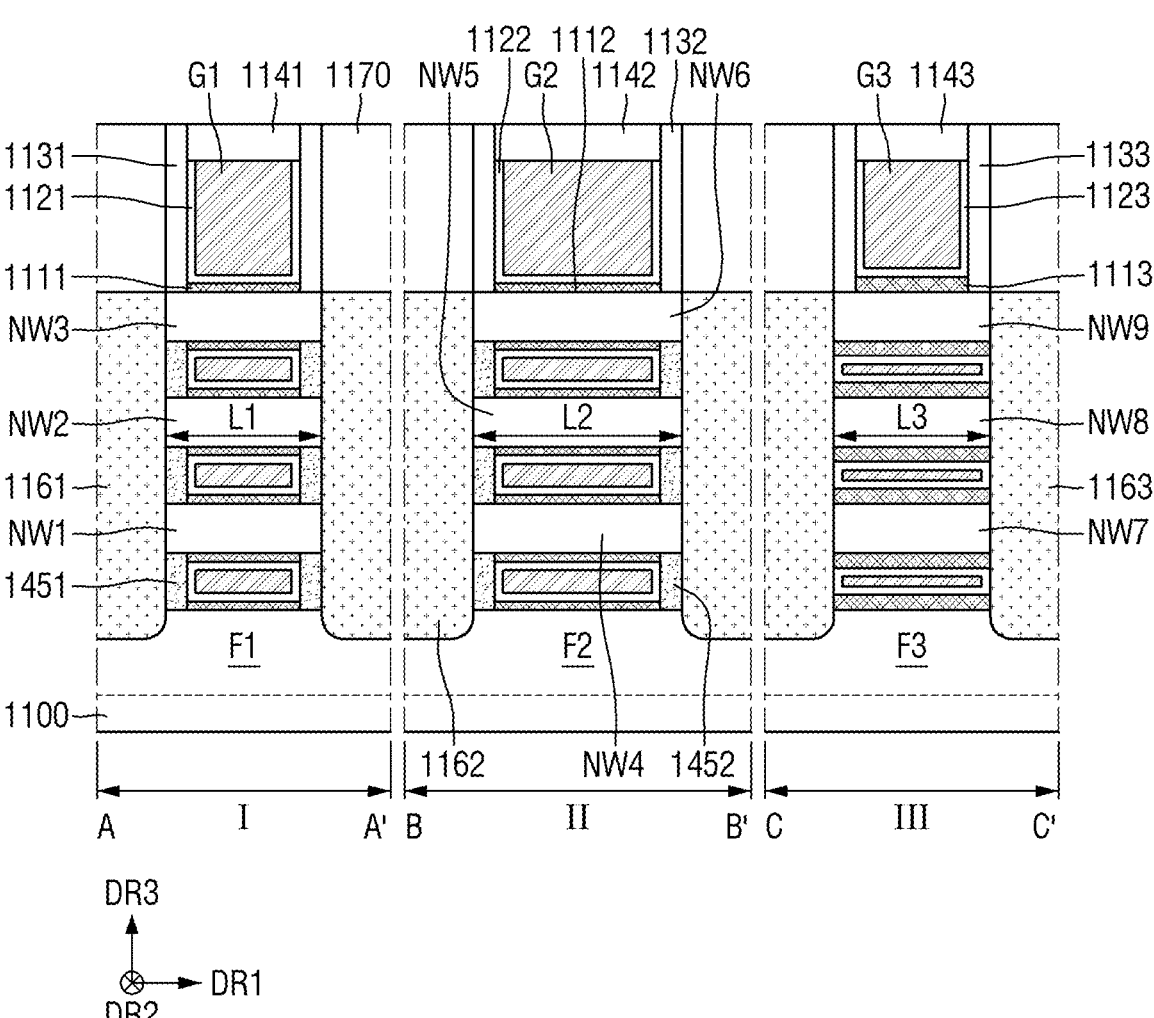
FIG. 7 is a cross-sectional view for explaining a semiconductor device according to some other embodiments of the present disclosure.

FIG. 7 is a cross-sectional view for explaining a semiconductor device according to some other embodiments of the present disclosure.

Referring to FIG. 7, in the semiconductor device according to some other embodiment of the present disclosure, a first internal spacer 1451 may be disposed on the side walls of the first gate electrode G1, and a second internal spacer 1452 may be disposed on the side walls of the second gate electrode G2.

The first internal spacer 1451 may be disposed between the first active pattern F1 and the first nanowire NW1, between the first nanowire NW1 and the second nanowire NW2, and between the second nanowire NW2 and the third nanowire NW3. The first internal spacer 1451 may be disposed between the first gate electrode G1 and the first source/drain region 1161.

The second internal spacer 1452 may be disposed between the second active pattern F2 and the fourth nanowire NW4, between the fourth nanowire NW4 and the fifth nanowire NW5, and between the fifth nanowire NW5 and the sixth nanowire NW6. The second internal spacer 1452 may be disposed between the second gate electrode G2 and the second source/drain region 1162.

An internal spacer is not disposed on the third active pattern F3. That is, the internal spacer is not disposed between the third plurality of nanowires NW7, NW8 and NW9.

Hereinafter, a semiconductor device according to some other embodiments of the present disclosure will be explained referring to FIG. 8. Differences from the semiconductor device shown in FIGS. 1 to 4 will be mainly explained.

Figure 8:
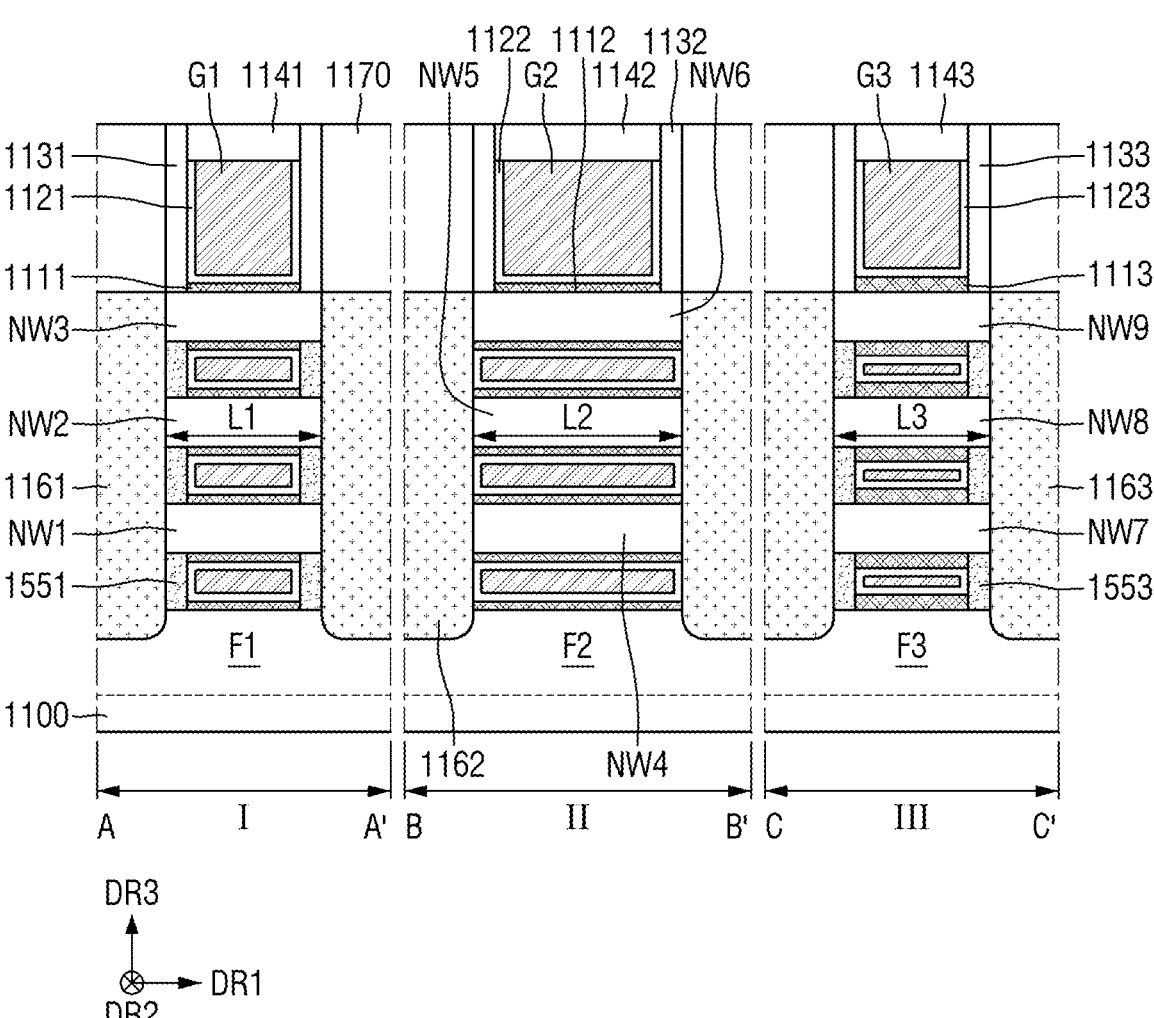
FIG. 8 is a cross-sectional view for explaining a semiconductor device according to some other embodiments of the present disclosure.

FIG. 8 is a cross-sectional view for explaining a semiconductor device according to some other embodiments of the present disclosure.

Referring to FIG. 8, in the semiconductor device according to some other embodiment of the present disclosure, a first internal spacer 1551 may be disposed on the side walls of the first gate electrode G1, and a third internal spacer 1553 may be disposed on the side walls of the third gate electrode G3.

The first internal spacer 1551 may be disposed between the first active pattern F1 and the first nanowire NW1, between the first nanowire NW1 and the second nanowire NW2, and between the second nanowire NW2 and the third nanowire NW3. The first internal spacer 1551 may be disposed between the first gate electrode G1 and the first source/drain region 1161.

The third internal spacer 1553 may be disposed between the third active pattern F3 and the seventh nanowire NW7, between the seventh nanowire NW7 and the eighth nanowire NW8, and between the eighth nanowire NW8 and the ninth nanowire NW9. The third internal spacer 1553 may be disposed between the third gate electrode G3 and the third source/drain region 1163.

An internal spacer is not disposed on the second active pattern F2. That is, the internal spacer is not disposed between the second plurality of nanowires NW4, NW5 and NW6.

Hereinafter, a semiconductor device according to some other embodiments of the present disclosure will be explained referring to FIG. 9. Differences from the semiconductor devices shown in FIGS. 1 to 4 will be mainly explained.

Figure 9:
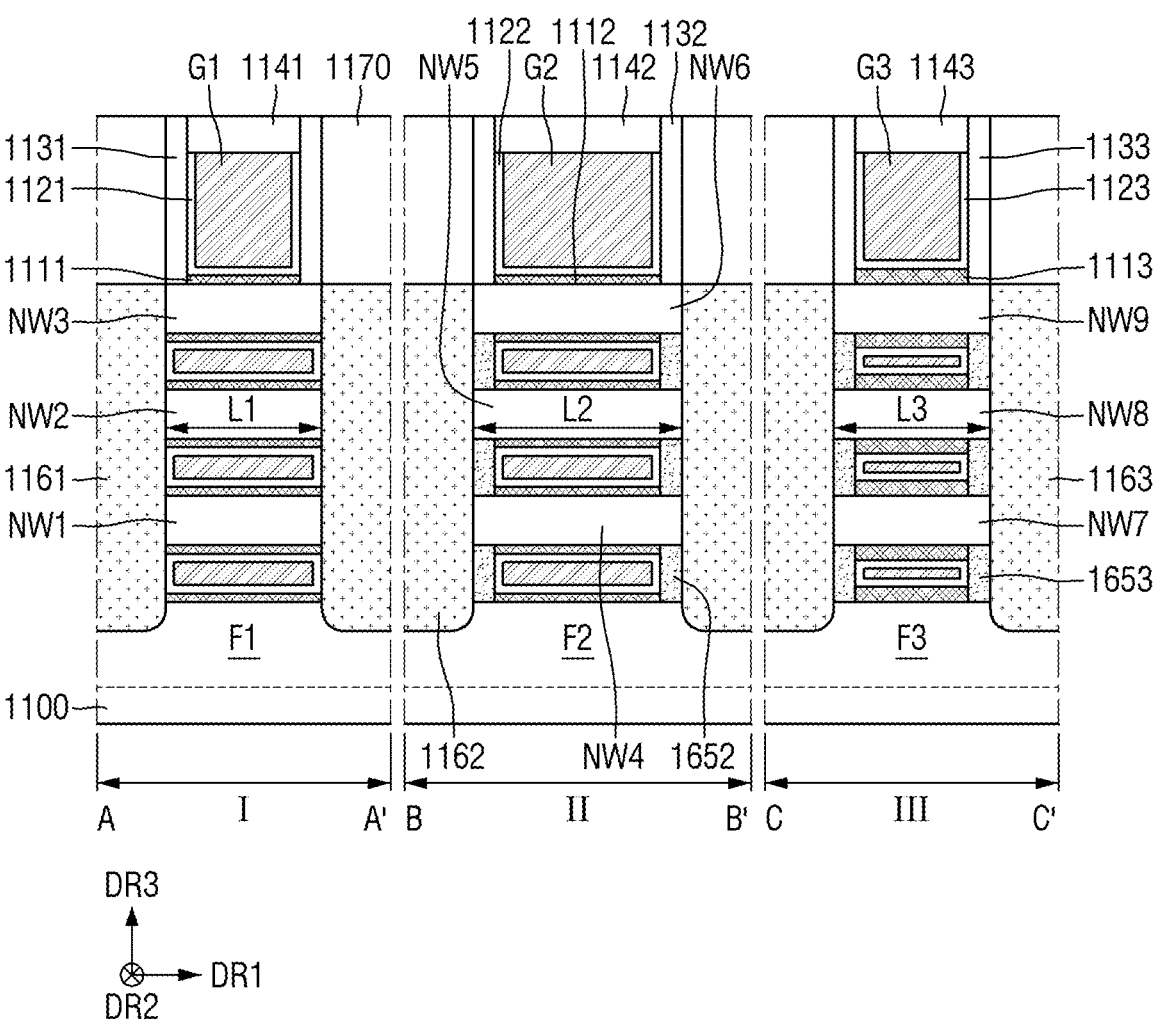
FIG. 9 is a cross-sectional view for explaining a semiconductor device according to some other embodiments of the present disclosure.

FIG. 9 is a cross-sectional view for explaining a semiconductor device according to some other embodiments of the present disclosure.

Referring to FIG. 9, in the semiconductor device according to some other embodiment of the present disclosure, a second internal spacer 1652 may be disposed on the side walls of the second gate electrode G2, and a third internal spacer 1653 may be disposed on the side walls of the third gate electrode G3.

The second internal spacer 1652 may be disposed between the second active pattern F2 and the fourth nanowire NW4, between the fourth nanowire NW4 and the fifth nanowire NW5, and between the fifth nanowire NW5 and the sixth nanowire NW6. The second internal spacer 1652 may be disposed between the second gate electrode G2 and the second source/drain region 1162.

The third internal spacer 1653 may be disposed between the third active pattern F3 and the seventh nanowire NW7, between the seventh nanowire NW7 and the eighth nanowire NW8, and between the eighth nanowire NW8 and the ninth nanowire NW9. The third internal spacer 1653 may be disposed between the third gate electrode G3 and the third source/drain region 1163.

An internal spacer is not disposed on the first active pattern F1. That is, the internal spacer is not disposed between the first plurality of nanowires NW1, NW2 and NW3.

Hereinafter, a semiconductor device according to some other embodiments of the present disclosure will be explained referring to FIG. 10. Differences from the semiconductor devices shown in FIGS. 1 to 4 will be mainly explained.

Figure 10:
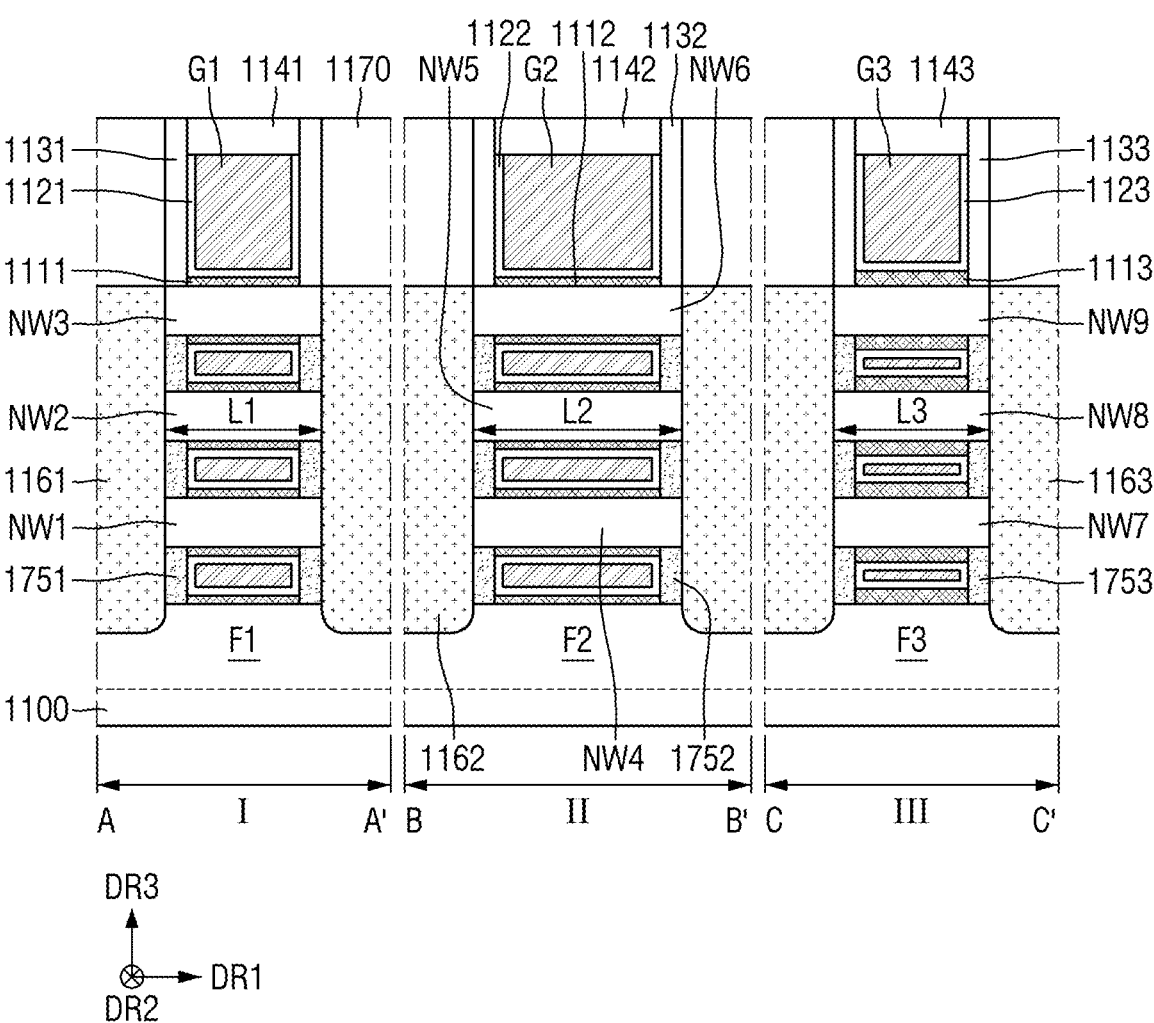
FIG. 10 is a cross-sectional view for explaining a semiconductor device according to some other embodiments of the present disclosure.

FIG. 10 is a cross-sectional view for explaining a semiconductor device according to some other embodiments of the present disclosure.

Referring to FIG. 10, in the semiconductor device according to some other embodiment of the present disclosure, a first internal spacer 1751 may be disposed on the side walls of the first gate electrode G1, a second internal spacer 1752 may be disposed on the side walls of the second gate electrode G2, and a third internal spacer 1753 may be disposed on the side walls of the third gate electrode G3.

The first internal spacer 1751 may be disposed between the first active pattern F1 and the first nanowire NW1, between the first nanowire NW1 and the second nanowire NW2, and between the second nanowire NW2 and the third nanowire NW3. The first internal spacer 1751 may be disposed between the first gate electrode G1 and the first source/drain region 1161.

The second internal spacer 1752 may be disposed between the second active pattern F2 and the fourth nanowire NW4, between the fourth nanowire NW4 and the fifth nanowire NW5, and between the fifth nanowire NW5 and the sixth nanowire NW6. The second internal spacer 1752 may be disposed between the second gate electrode G2 and the second source/drain region 1162.

The third internal spacer 1753 may be disposed between the third active pattern F3 and the seventh nanowire NW7, between the seventh nanowire NW7 and the eighth nanowire NW8, and between the eighth nanowire NW8 and the ninth nanowire NW9. The third internal spacer 1753 may be disposed between the third gate electrode G3 and the third source/drain region 1163.

Hereinafter, a semiconductor device according to some other embodiments of the present disclosure will be explained referring to FIGS. 11 to 14. Differences from the semiconductor devices shown in FIGS. 1 to 4 will be mainly explained.

Figure 11:
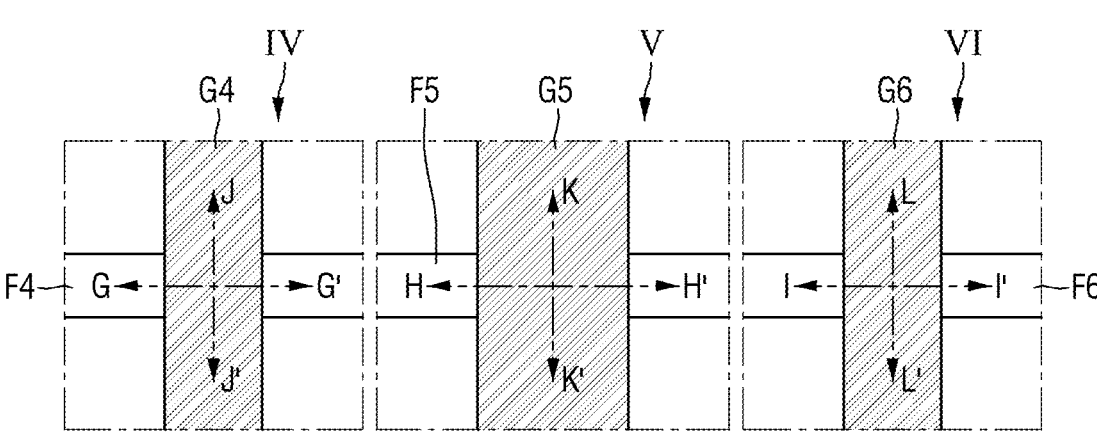
FIG. 11 is a schematic layout diagram for explaining a semiconductor device according to some other embodiments of the present disclosure.
Figure 11:
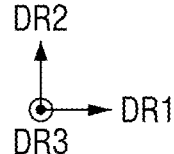
Figure 12:
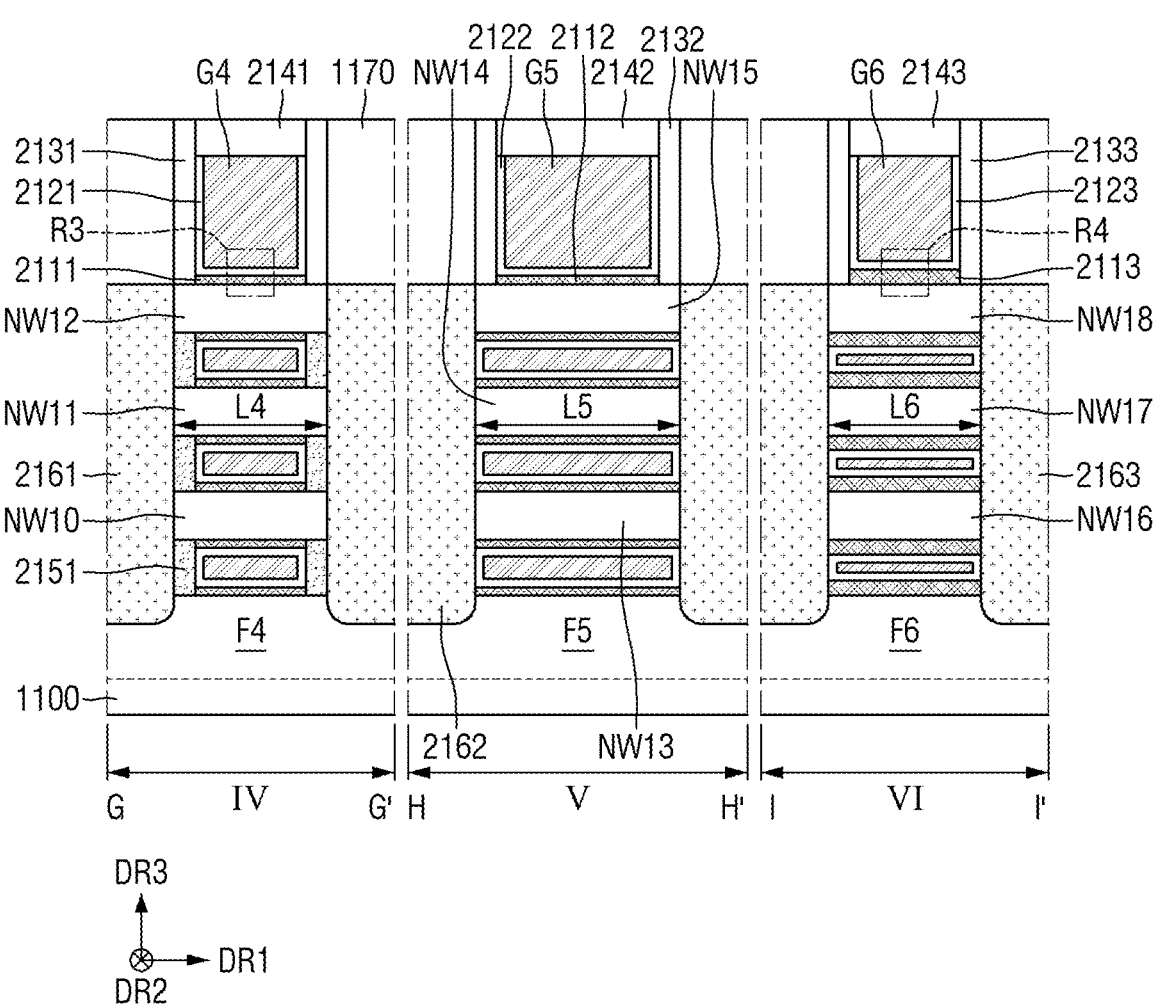
FIG. 12 is a cross-sectional view taken along each of lines G-G', H-H' and I-I' of FIG. 11.
Figure 13:
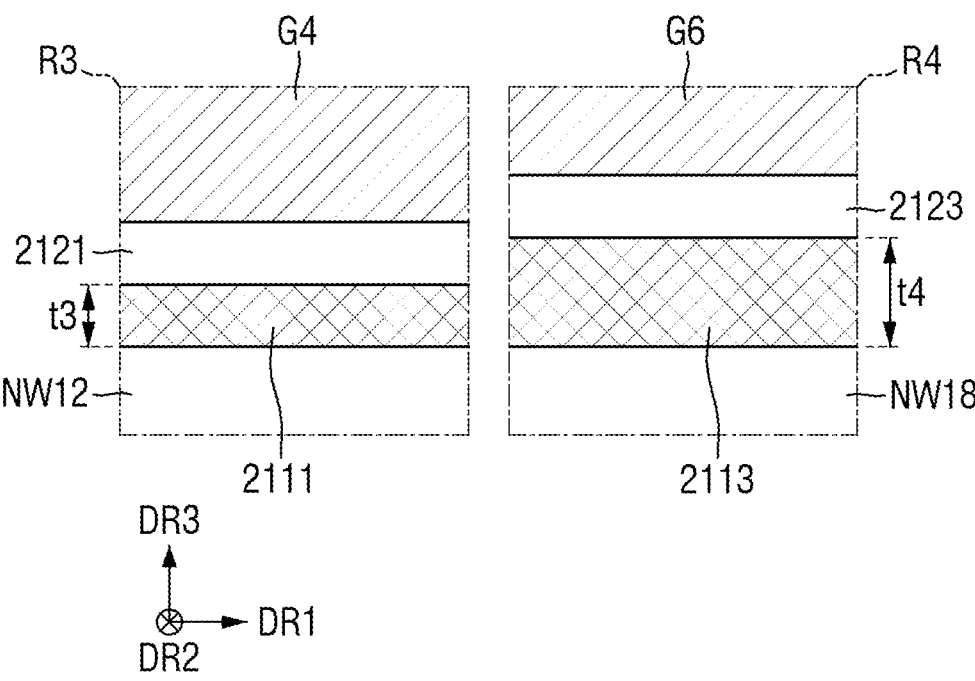
FIG. 13 is an enlarged view of each of a region R3 and a region R4 of FIG. 12.
Figure 14:
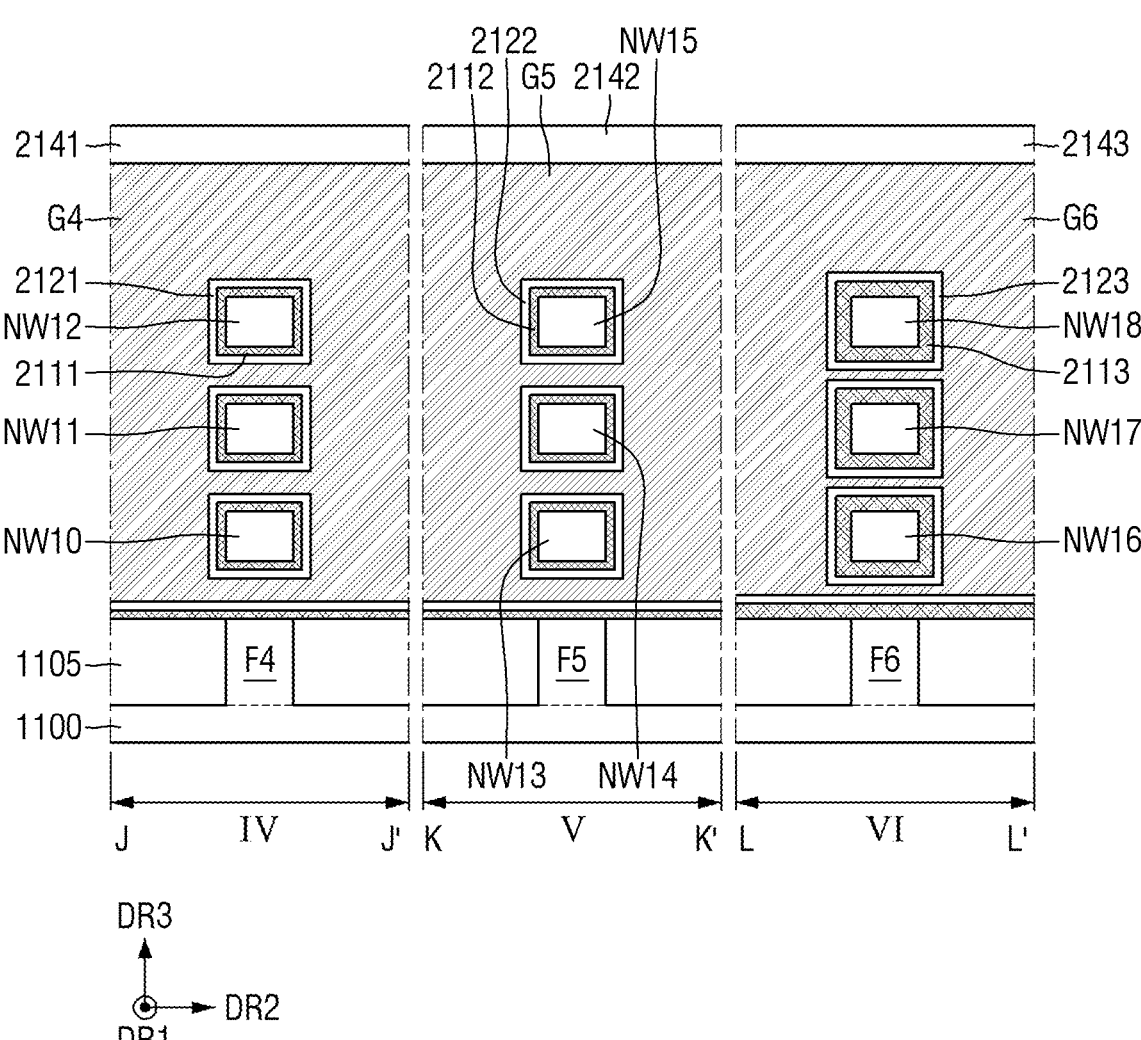
FIG. 14 is a cross-sectional view taken along each of lines J-J', K-K' and L-L' of FIG. 11.

FIG. 11 is a schematic layout diagram for explaining a semiconductor device according to some other embodiments of the present disclosure. FIG. 12 is a cross-sectional view taken along each of lines G-G', H-H' and I-I' of FIG. 11. FIG. 13 is an enlarged view of each of a region R3 and a region R4 of FIG. 12. FIG. 14 is a cross-sectional view taken along each of lines J-J', K-K' and L-L' of FIG. 11.

Referring to FIGS. 11 to 14, in a semiconductor device according to some other embodiments of the present disclosure, fourth to sixth regions IV, V and VI, which are PMOS regions, may be defined on the substrate 1100. A PFET (P-type Fin Field Effect Transistor) may be formed on the fourth to sixth regions IV, V and VI of the substrate 1100.

Different elements may be formed on each of the fourth to sixth regions IV, V and VI of the substrate 1100. For example, a PMOS region of the SRAM element or a PMOS region of a standard gate short channel (SG SC) element may be formed on a fourth region IV of the substrate 1100. For example, a PMOS region of a standard gate long channel (SG LC) element may be formed on a fifth region V of the substrate 1100. For example, a PMOS region of a thick oxide gate (EG) element may be formed on a sixth region VI of the substrate 1100.

Each of fourth to sixth active patterns F4, F5 and F6, tenth to eighteenth nanowires NW10 to NW18, fourth to sixth gate electrodes G4, G5 and G6, fourth to sixth interface layers 2111, 2112 and 2113, fourth to sixth gate insulation layers 2121, 2122 and 2123, fourth to sixth external spacers 2131, 2132 and 2133, fourth to sixth capping patterns 2141, 2142 and 2143, the fourth internal spacer 2151, and fourth to sixth source/drain regions 2161, 2162 and 2163 shown in FIG. 12 may have structures similar to those of each of the first to third active patterns F1, F2 and F3, the first to ninth nanowires NW1 to NW9, the first to third gate electrodes G1, G2 and G3, the first to third interface layers 1111, 1112 and 1113, the first to third gate insulation layers 1121, 1122 and 1123, the first to third external spacers 1131, 1132 and 1133, the first to third capping patterns 1141, 1142 and 1143, the first internal spacer 1151, and the first to third source/drain regions 1161, 1162 and 1163. Therefore, a detailed explanation thereof will not be provided.

Each of the fourth plurality of nanowires NW10, NW11 and NW12 may have a fourth length L4 in the first direction DR1. Each of the fifth plurality of nanowires NW13, NW14 and NW15 may have a fifth length L5 in the first direction DR1 that is larger than the fourth length L4. Each of the sixth plurality of nanowires NW16, NW17 and NW18 may have a sixth length L6 in the first direction DR1 that is smaller than the fifth length L5. For example, the sixth length L6 may be the same as the fourth length L4. However, the present disclosure is not limited thereto.

Each of the fourth length L4 and the sixth length L6 may be, for example, 5 nm to 20 nm. The fifth length L5 may be, for example, 30 nm to 300 nm.

The fourth thickness t4 of the sixth interface layer 2113 may be greater than the third thickness t3 of the fourth interface layer 2111. Further, the fourth thickness t4 of the sixth interface layer 2113 may be greater than the thickness of the fifth interface layer 2112. For example, the third thickness t3 of the fourth interface layer 2111 may be the same as the thickness of the fifth interface layer 2112. However, the present disclosure is not limited thereto.

Each of the third thickness t3 of the fourth interface layer 2111 and the thickness of the fifth interface layer 2112 may be, for example, 0.2 nm to 2 nm. The fourth thickness t4 of the sixth interface layer 2113 may be, for example, 2.5 nm to 4.5 nm.

The fourth internal spacer 2151 may be disposed between the fourth active pattern F4 and the fourth nanowire NW4, between the fourth nanowire NW4 and the fifth nanowire NW5, and between the fifth nanowire NW5 and the sixth nanowire NW6. The fourth internal spacer 2151 may be disposed on the side walls of the fourth gate electrode G4. That is, the fourth internal spacer 2151 may be disposed between the fourth gate electrode G4 and the fourth source/drain region 2161.

An internal spacer is not disposed on a fifth active pattern F5 and a sixth active pattern F6. That is, an internal spacer is not disposed between the fifth plurality of nanowires NW13, NW14 and NW15 and between the sixth plurality of nanowires NW16, NW17 and NW18.

Each of the fourth to sixth source/drain regions 2161, 2162 and 2163 may include compressive stress substance. The compressive stress substance may be a substance having a larger lattice constant than silicon (Si), for example, silicon germanium (SiGe).

Hereinafter, a semiconductor device according to some other embodiments of the present disclosure will be explained referring to FIG. 15. Differences from the semiconductor devices shown in FIGS. 11 to 14 will be mainly explained.

Figure 15:
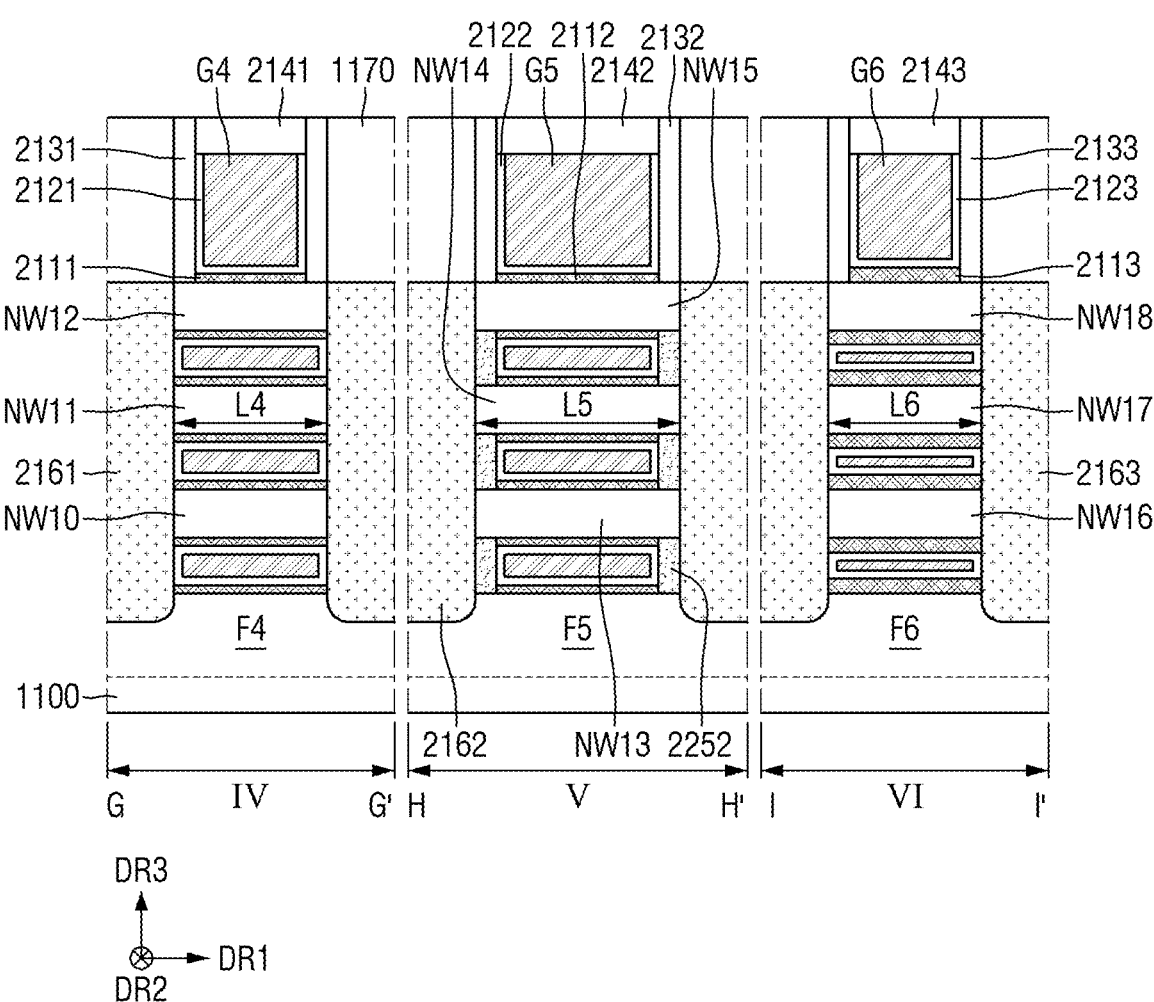
FIG. 15 is a cross-sectional view for explaining a semiconductor device according to some other embodiments of the present disclosure.

FIG. 15 is a cross-sectional view for explaining a semiconductor device according to some other embodiments of the present disclosure.

Referring to FIG. 15, the semiconductor device according to some other embodiment of the present disclosure may have a fifth internal spacer 2252 disposed on the side walls of the fifth gate electrode G5.

The fifth internal spacer 2252 may be disposed between the fifth active pattern F5 and a thirteenth nanowire NW13, between the thirteenth nanowire NW13 and a fourteenth nanowire NW14, and between the fourteenth nanowire NW14 and a fifteenth nanowire NW15. The fifth internal spacer 2252 may be disposed between the fifth gate electrode G5 and the fifth source/drain region 2162.

An internal spacer is not disposed on the fourth active pattern F4 and the sixth active pattern F6. That is, an internal spacer is not disposed between the fourth plurality of nanowires NW10, NW11 and NW12 and between the sixth plurality of nanowires NW16, NW17 and NW18.

Hereinafter, a semiconductor device according to some other embodiments of the present disclosure will be explained referring to FIG. 16. Differences from the semiconductor devices shown in FIGS. 11 to 14 will be mainly explained.

Figure 16:
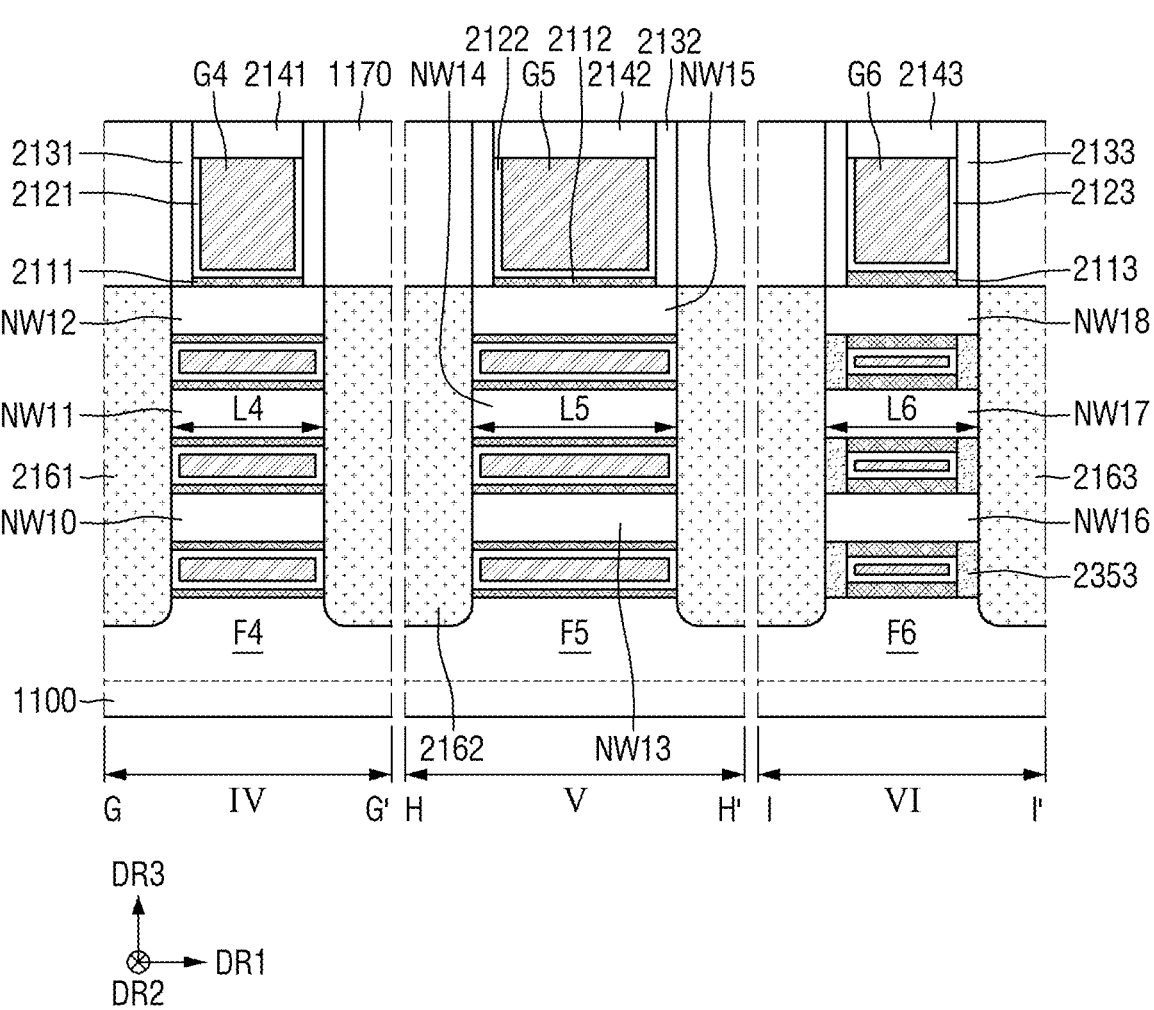
FIG. 16 is a cross-sectional view for explaining a semiconductor device according to some other embodiments of the present disclosure.

FIG. 16 is a cross-sectional view for explaining a semiconductor device according to some other embodiments of the present disclosure.

Referring to FIG. 16, in the semiconductor device according to some other embodiment of the present disclosure, a sixth internal spacer 2353 may be disposed on the side walls of the sixth gate electrode G6.

The sixth internal spacer 2353 may be disposed between the sixth active pattern F6 and a sixteenth nanowire NW16, between the sixteenth nanowire NW16 and a seventeenth nanowire NW17, and between the seventeenth nanowire NW17 and an eighteenth nanowire NW18. The sixth internal spacer 2353 may be disposed between the sixth gate electrode G6 and the sixth source/drain region 2163.

An internal spacer is not disposed on the fourth active pattern F4 and the fifth active pattern F5. That is, an internal spacer is not disposed between the fourth plurality of nanowires NW10, NW11 and NW12 and between the fifth plurality of nanowires NW13, NW14 and NW15.

Hereinafter, a semiconductor device according to some other embodiments of the present disclosure will be explained referring to FIG. 17. Differences from the semiconductor devices shown in FIGS. 11 to 14 will be mainly explained.

Figure 17:
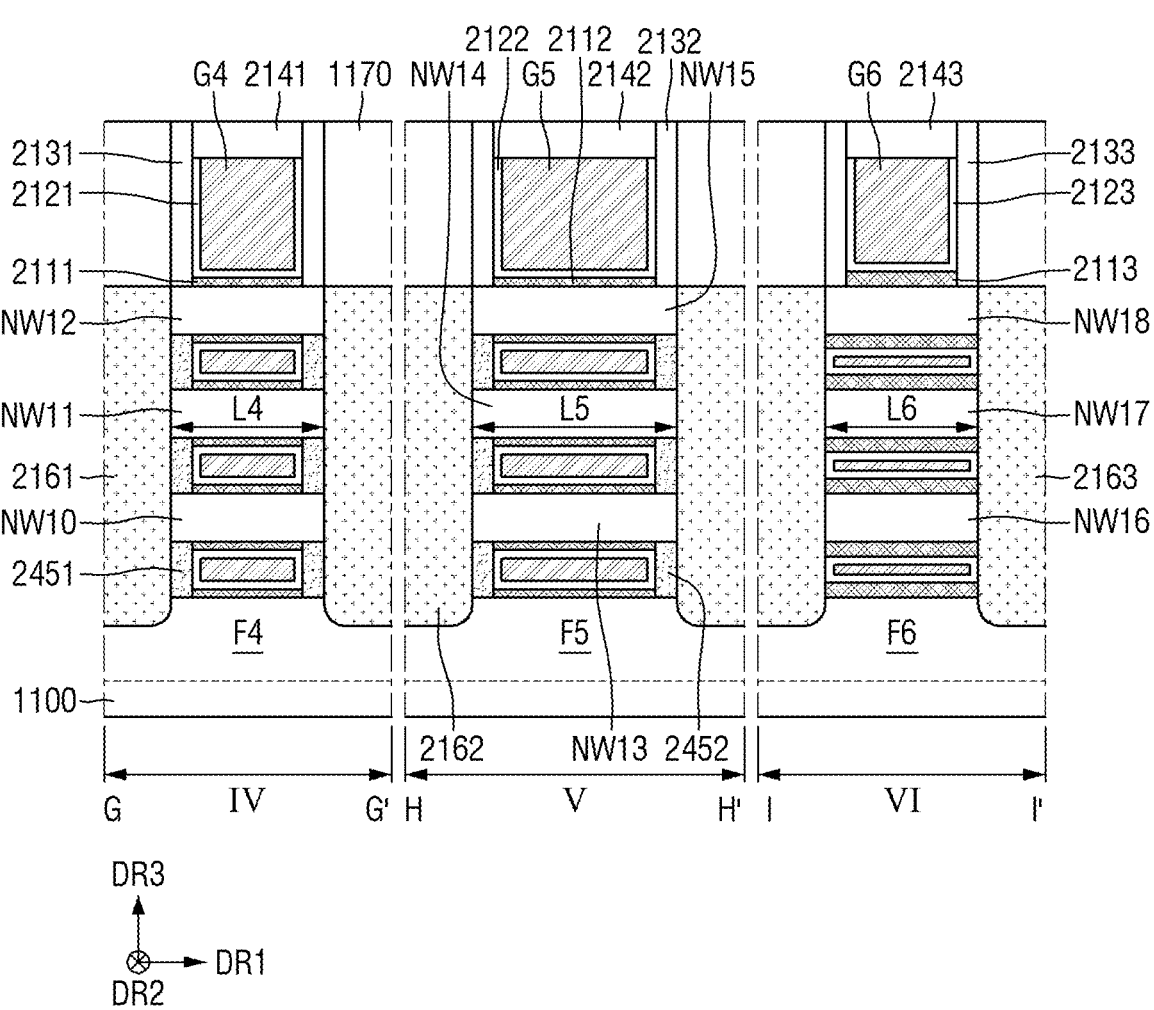
FIG. 17 is a cross-sectional view for explaining a semiconductor device according to some other embodiments of the present disclosure.

FIG. 17 is a cross-sectional view for explaining a semiconductor device according to some other embodiments of the present disclosure.

Referring to FIG. 17, in the semiconductor device according to some other embodiment of the present disclosure, a fourth internal spacer 2451 may be disposed on the side walls of the fourth gate electrode G4, and a fifth internal spacer 2452 may be disposed on the side walls of the fifth gate electrode G5.

The fourth internal spacer 2451 may be disposed between the fourth active pattern F4 and a tenth nanowire NW10, between the tenth nanowire NW10 and an eleventh nanowire NW11, and between the eleventh nanowire NW11 and a twelfth nanowire NW12. A fourth internal spacer 2451 may be disposed between the fourth gate electrode G4 and the fourth source/drain region 2161.

The fifth internal spacer 2452 may be disposed between the fifth active pattern F5 and the thirteenth nanowire NW13, between the thirteenth nanowire NW13 and the fourteenth nanowire NW14, and between the fourteenth nanowire NW14 and a fifteenth nanowire NW15. The fifth internal spacer 2452 may be disposed between the fifth gate electrode G5 and the fifth source/drain region 2162.

An internal spacer is not disposed on the sixth active pattern F6. That is, the internal spacer is not disposed between the sixth plurality of nanowires NW16, NW17 and NW18.

Hereinafter, a semiconductor device according to some other embodiments of the present disclosure will be explained referring to FIG. 18. Differences from the semiconductor devices shown in FIGS. 11 to 14 will be mainly explained.

Figure 18:
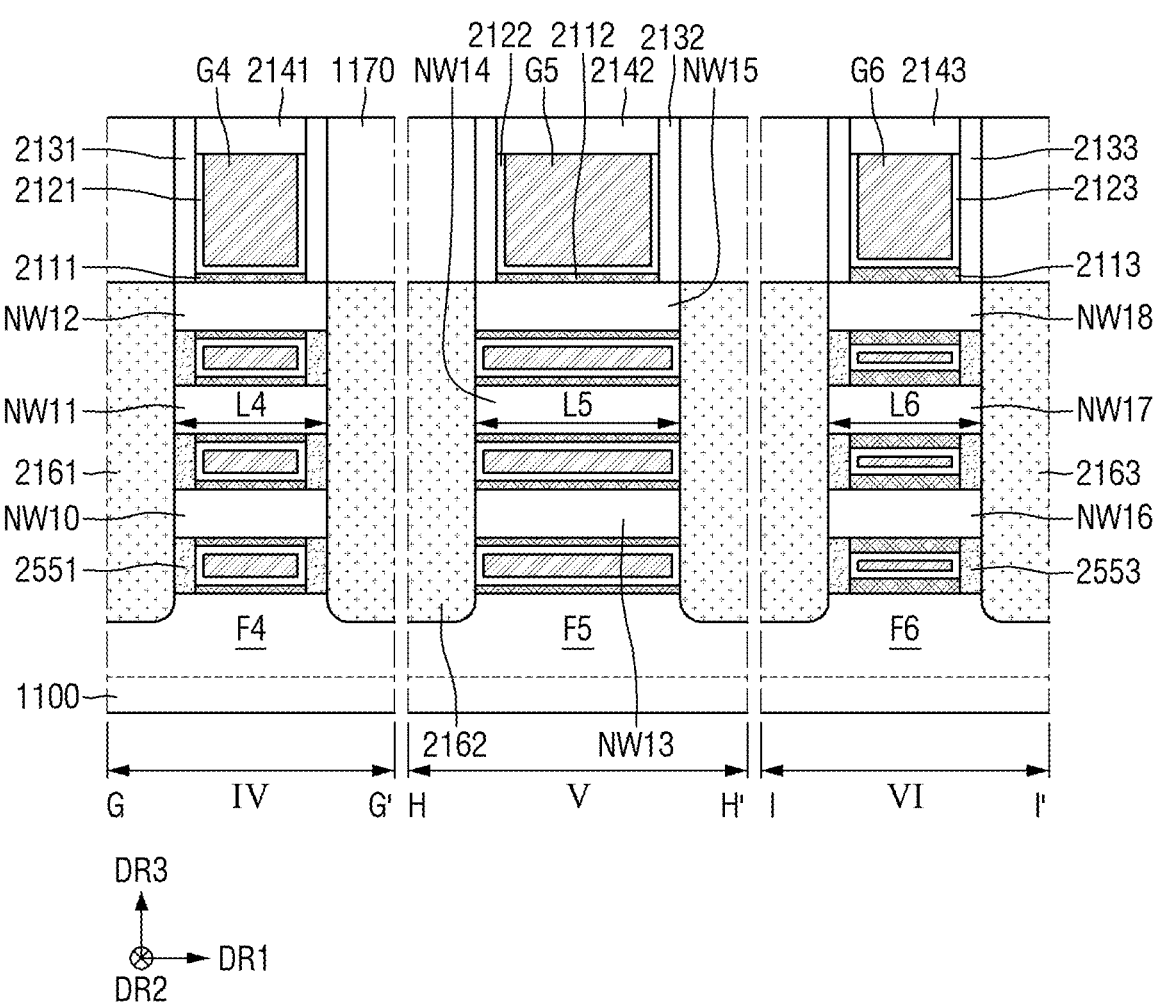
FIG. 18 is a cross-sectional view for explaining a semiconductor device according to some other embodiments of the present disclosure.

FIG. 18 is a cross-sectional view for explaining a semiconductor device according to some other embodiments of the present disclosure.

Referring to FIG. 18, in the semiconductor device according to some other embodiment of the present disclosure, a fourth internal spacer 2551 may be disposed on the side walls of the fourth gate electrode G4, and a sixth internal spacer 2553 may be disposed on the side walls of the sixth gate electrode G6.

The fourth internal spacer 2551 may be disposed between the fourth active pattern F4 and the tenth nanowire NW10, between the tenth nanowire NW10 and the eleventh nanowire NW11, and between the eleventh nanowire NW11 and the twelfth nanowire NW12. The fourth internal spacer 2551 may be disposed between the fourth gate electrode G4 and the fourth source/drain region 2161.

The sixth internal spacer 2553 may be disposed between the sixth active pattern F6 and the sixteenth nanowire NW16, between the sixteenth nanowire NW16 and the seventeenth nanowire NW17, and between the seventeenth nanowire NW17 and the eighteenth nanowire NW18. The sixth internal spacer 2553 may be disposed between the sixth gate electrode G6 and the sixth source/drain region 2163.

An internal spacer is not disposed on the fifth active pattern F5. That is, the internal spacer is not disposed between the fifth plurality of nanowires NW13, NW14 and NW15.

Hereinafter, a semiconductor device according to some other embodiments of the present disclosure will be explained referring to FIG. 19. Differences from the semiconductor devices shown in FIGS. 11 to 14 will be mainly explained.

Figure 19:
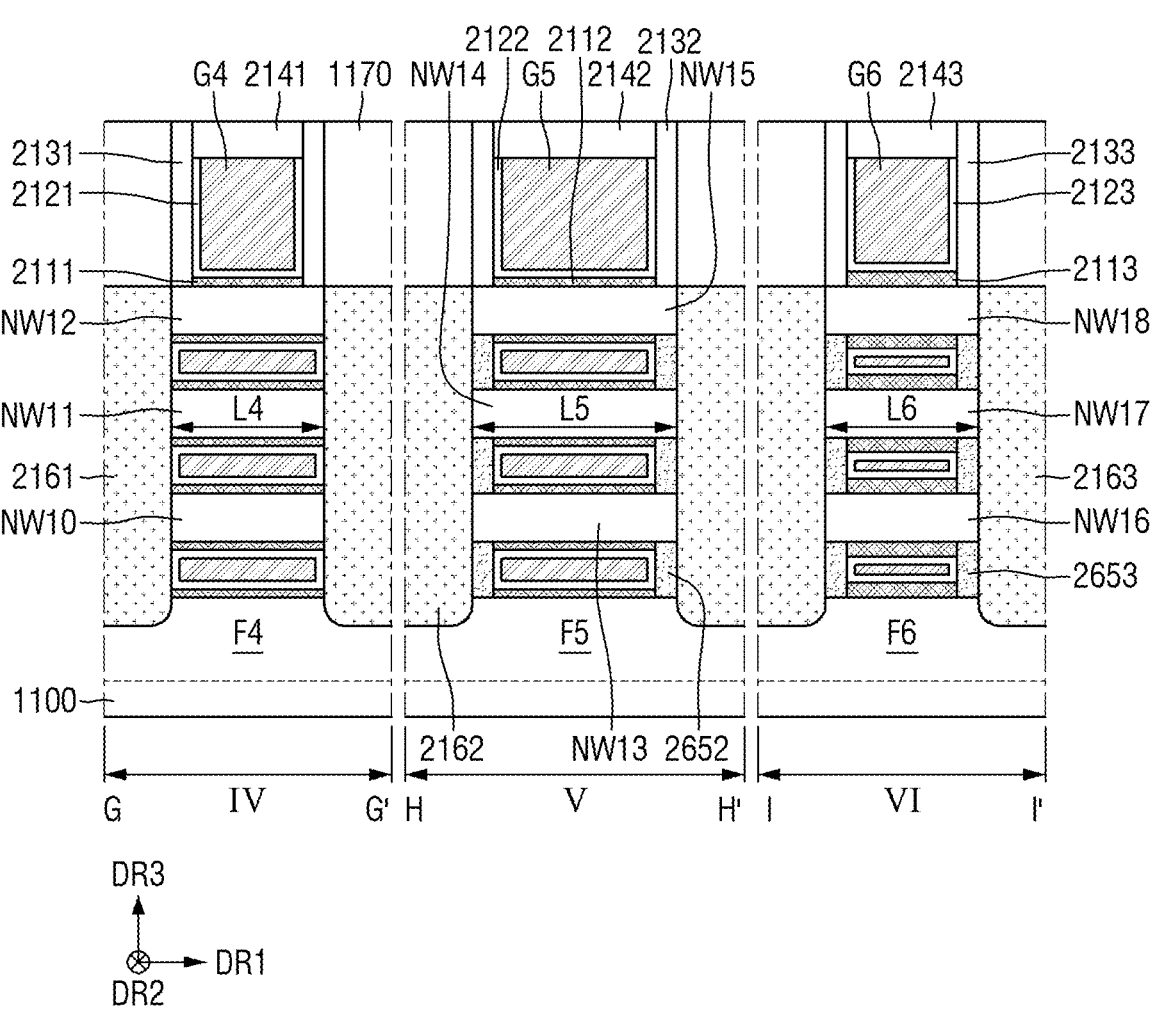
FIG. 19 is a cross-sectional view for explaining a semiconductor device according to some other embodiments of the present disclosure.

FIG. 19 is a cross-sectional view for explaining a semiconductor device according to some other embodiments of the present disclosure.

Referring to FIG. 19, in the semiconductor device according to some other embodiment of the present disclosure, a second internal spacer 1652 may be disposed on the side walls of the second gate electrode G2, and a third internal spacer 1653 may be disposed on the side walls of the third gate electrode G3.

A fifth internal spacer 2652 may be disposed between the fifth active pattern F5 and the thirteenth nanowire NW13, between the thirteenth nanowire NW13 and the fourteenth nanowire NW14, and between the fourteenth nanowire NW14 and the fifteenth nanowire NW15. The fifth internal spacer 2652 may be disposed between the fifth gate electrode G5 and the fifth source/drain region 2162.

The sixth internal spacer 2653 may be disposed between the sixth active pattern F6 and the sixteenth nanowire NW16, between the sixteenth nanowire NW16 and the seventeenth nanowire NW17, and between the seventeenth nanowire NW17 and the eighteenth nanowire NW18. A sixth internal spacer 2653 may be disposed between the sixth gate electrode G6 and the sixth source/drain region 2163.

An internal spacer is not disposed on the fourth active pattern F4. That is, the internal spacer is not disposed between the fourth plurality of nanowires NW10, NW11 and NW12.

Hereinafter, a semiconductor device according to some other embodiments of the present disclosure will be explained referring to FIG. 20. Differences from the semiconductor devices shown in FIGS. 11 to 14 will be mainly explained.

Figure 20:
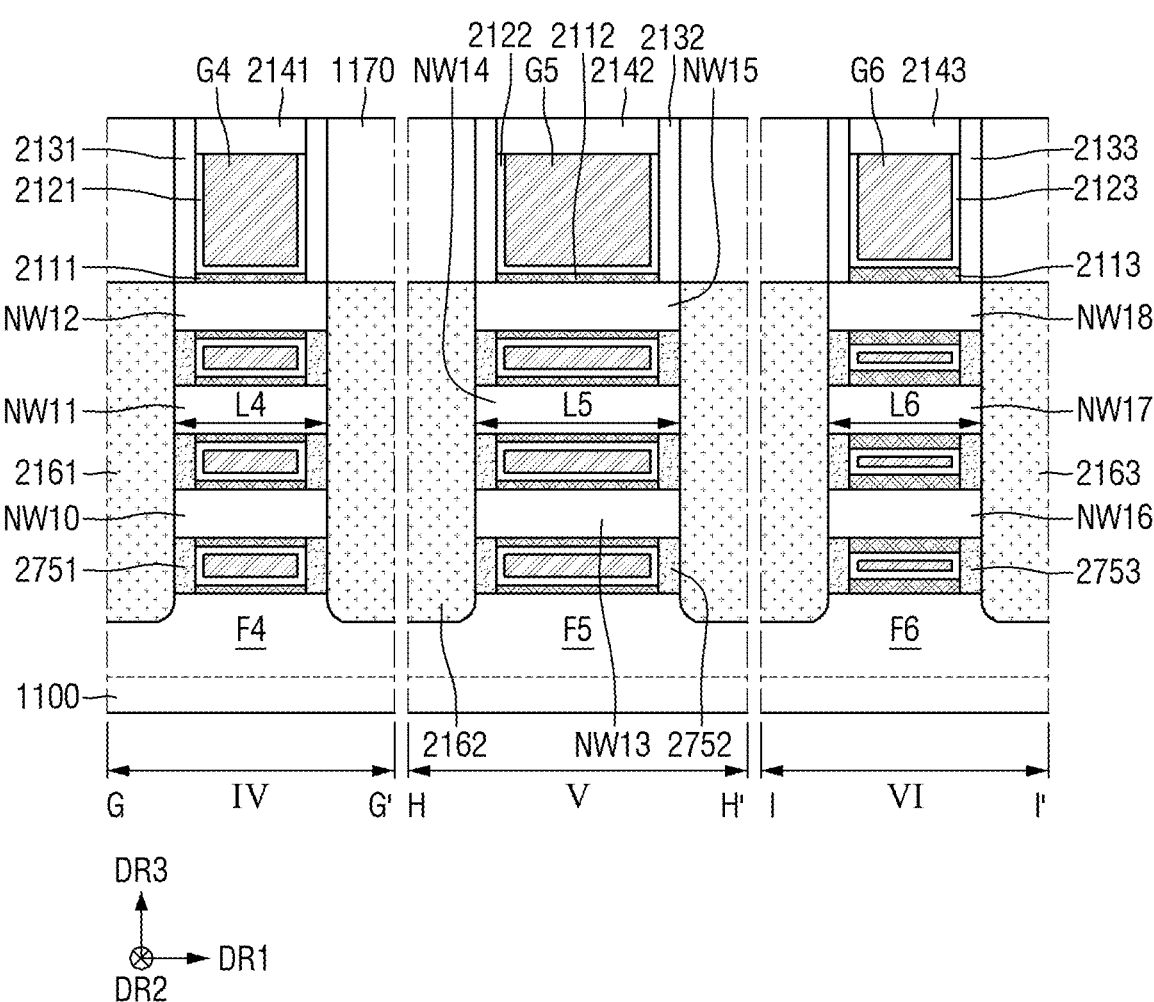
FIG. 20 is a cross-sectional view for explaining a semiconductor device according to some other embodiments of the present disclosure.

FIG. 20 is a cross-sectional view for explaining a semiconductor device according to some other embodiments of the present disclosure.

Referring to FIG. 20, in the semiconductor device according to some other embodiment of the present disclosure, a fourth internal spacer 2751 may be disposed on the side walls of the fourth gate electrode G4, a fifth internal spacer 2752 may be disposed on the side walls of the fifth gate electrode G5, and a sixth internal spacer 2753 may be disposed on the side walls of the sixth gate electrode G6.

The fourth internal spacer 2751 may be disposed between the fourth active pattern F4 and the tenth nanowire NW10, between the tenth nanowire NW10 and the eleventh nanowire NW11, and between the eleventh nanowire NW11 and the twelfth nanowire NW12. The fourth internal spacer 2751 may be disposed between the fourth gate electrode G4 and the fourth source/drain region 2161.

The fifth internal spacer 2752 may be disposed between the fifth active pattern F5 and the thirteenth nanowire NW13, between the thirteenth nanowire NW13 and the fourteenth nanowire NW14, and between the fourteenth nanowire NW14 and the fifteenth nanowire NW15. The fifth internal spacer 2752 may be disposed between the fifth gate electrode G5 and the fifth source/drain region 2162.

The sixth internal spacer 2753 may be disposed between the sixth active pattern F6 and the sixteenth nanowire NW16, between the sixteenth nanowire NW16 and the seventeenth nanowire NW17, and between the seventeenth nanowire NW17 and the eighteenth nanowire NW18. The sixth internal spacer 2753 may be disposed between the sixth gate electrode G6 and the sixth source/drain region 2163.

Hereinafter, the semiconductor devices according to some other embodiments of the present disclosure will be explained referring to Table 1.

Table 1 shows the presence or absence of the internal spacer for each of the SRAM element (or standard gate short channel (SG SC) element), the standard gate long channel (SG LC) element, and the thick oxide gate (EG) element in each of the NMOS region and the PMOS region. In Table 1, symbol O means that an internal spacer is formed, and symbol X means that an internal spacer is not formed.

For example, in Table 1, in a semiconductor device corresponding to Example 16, an internal spacer is formed only in the SRAM element (or GS SC element) in the NMOS region, and an internal spacer is formed only in the SG LC element in the PMOS region.

TABLE 1

| | NMOS | | | PMOS | | |
|---|---|---|---|---|---|---|
| Example | SRAM(or GS SC) | SG LC | EG | SRAM(or GS SC) | SG LC | EG |
| 15 | O | X | X | O | X | X |
| 16 | O | X | X | X | O | X |
| 17 | O | X | X | X | X | O |
| 18 | O | X | X | O | O | X |
| 19 | O | X | X | O | X | O |
| 20 | O | X | X | X | O | O |
| 21 | O | X | X | O | O | O |
| 22 | X | O | X | O | X | X |
| 23 | X | O | X | X | O | X |
| 24 | X | O | X | X | X | O |
| 25 | X | O | X | O | O | X |
| 26 | X | O | X | O | X | O |
| 27 | X | O | X | X | O | O |
| 28 | X | O | X | O | O | O |
| 29 | X | X | O | O | X | X |
| 30 | X | X | O | X | O | X |
| 31 | X | X | O | X | X | O |
| 32 | X | X | O | O | O | X |
| 33 | X | X | O | O | X | O |
| 34 | X | X | O | X | O | O |
| 35 | X | X | O | O | O | O |
| 36 | O | O | X | O | X | X |
| 37 | O | O | X | X | O | X |
| 38 | O | O | X | X | X | O |
| 39 | O | O | X | O | O | X |
| 40 | O | O | X | O | X | O |
| 41 | O | O | X | X | O | O |
| 42 | O | O | X | O | O | O |
| 43 | O | X | O | O | X | X |
| 44 | O | X | O | X | O | X |
| 45 | O | X | O | X | X | O |
| 46 | O | X | O | O | O | X |
| 47 | O | X | O | O | X | O |
| 48 | O | X | O | X | O | O |
| 49 | O | X | O | O | O | O |
| 50 | X | O | O | O | X | X |
| 51 | X | O | O | X | O | X |
| 52 | X | O | O | X | X | O |
| 53 | X | O | O | O | O | X |
| 54 | X | O | O | O | X | O |
| 55 | X | O | O | X | O | O |
| 56 | X | O | O | O | O | O |
| 57 | O | O | O | O | X | X |
| 58 | O | O | O | X | O | X |
| 59 | O | O | O | X | X | O |
| 60 | O | O | O | O | O | X |
| 61 | O | O | O | O | X | O |
| 62 | O | O | O | X | O | O |
| 63 | O | O | O | O | O | O |

Since formation of the internal spacers for each of the SRAM element (or standard gate short channel (SG SC) element), the standard gate long channel (SG LC) element, and the thick oxide gate (EG) element in each of the NMOS region and the PMOS region is explained in detail in FIGS. 1 to 20, explanation thereof will not be provided The semiconductor device according to some embodiments of the present disclosure can effectively control capacitance of each of the plurality of elements, by combining the presence or absence of the internal spacers in each of the plurality of elements.

In concluding the detailed description, those skilled in the art will appreciate that many variations and modifications may be made to the presented embodiments without substantially departing from the principles of the present disclosure. Therefore, the disclosed embodiments of the disclosure are used in a generic and descriptive sense only and not for purposes of limitation.

What is claimed is:

1. A semiconductor device comprising:

a substrate including a first region, a second region, and a third region;

a first nanowire and a second nanowire, which are sequentially spaced apart from each other and stacked on the first region of the substrate, the first nanowire and the second nanowire each extending in a first direction;

a third nanowire and a fourth nanowire, which are sequentially spaced apart from each other and stacked on the second region of the substrate, the third nanowire and the fourth nanowire each extending in the first direction;

a fifth nanowire and a sixth nanowire, which are sequentially spaced apart from each other and stacked on the third region of the substrate, the fifth nanowire and the sixth nanowire each extending in the first direction;

a first gate electrode surrounding the first nanowire and the second nanowire, the first gate electrode extending in a second direction different from the first direction;

a second gate electrode surrounding the third nanowire and the fourth nanowire, the second gate electrode extending in the second direction;

a third gate electrode surrounding the fifth nanowire and the sixth nanowire, the third gate electrode extending in the second direction;

a first interface layer between the first gate electrode and the second nanowire, the first interface layer having a first thickness, the first interface layer being in contact with each of an upper face and a bottom face of the second nanowire;

a second interface layer between the third gate electrode and the sixth nanowire, the second interface layer having a second thickness greater than the first thickness, the second interface layer being in contact with each of an upper face and a bottom face of the sixth nanowire; and a first internal spacer on a side wall of at least one of the first gate electrode, the second gate electrode, and the third gate electrode, wherein a first length of the first nanowire in the first direction is smaller than a second length of the third nanowire in the first direction, wherein a thickness of a top region of the first gate electrode over the second nanowire is thicker than an intermediate region of the first gate electrode between the first nanowire and the second nanowire, and wherein the first internal spacer is on one sidewall selected from the sidewall of the first gate electrode, the sidewall of the second gate electrode, and the sidewall of the third gate electrode, provided that the first internal spacer is not on two different sidewalls selected from the sidewall of the first gate electrode, the sidewall of the second gate electrode, and the sidewall of the third gate electrode, or the first internal spacer is on two sidewalls selected from the sidewall of the first gate electrode, the sidewall of the second gate electrode, and the sidewall of the third gate electrode, provided that the first internal spacer is not on one different sidewall selected from the sidewall of the first gate electrode, the sidewall of the second gate electrode, and the sidewall of the third gate electrode.

2. The semiconductor device of claim 1, wherein each of the first region, the second region, and the third region of the substrate is an NMOS region, or each of the first region, the second region, and the third region of the substrate is a PMOS region.

3. The semiconductor device of claim 2, further comprising:

a seventh nanowire, an eighth nanowire, a ninth nanowire, a tenth nanowire, an eleventh nanowire, and a twelfth nanowire each extending in the first direction;

a fourth gate electrode, a fifth gate electrode, and a sixth gate electrode each extending in the second direction;

a third interface layer between the fourth gate electrode and the eighth nanowire, the third interface layer having a third thickness;

a fourth interface layer between the sixth gate electrode and the twelfth nanowire, the fourth interface layer having a fourth thickness greater than the third thickness; and a second internal spacer on side walls of at least one of the fourth gate electrode, the fifth gate electrode, and the sixth gate electrode, wherein the substrate further includes a fourth region, a fifth region, and a sixth region as the PMOS region, the seventh nanowire and the eighth nanowire are sequentially spaced apart from each other and stacked on the fourth region of the substrate, the ninth nanowire and the tenth nanowire are sequentially spaced apart from each other and stacked on the fifth region of the substrate, the eleventh nanowire and the twelfth nanowire are sequentially separated from each other and stacked on the sixth region of the substrate, the fourth gate electrode surrounds the seventh nanowire and the eighth nanowire, the fifth gate electrode surrounds the ninth nanowire and the tenth nanowire, the sixth gate electrode surrounds the eleventh nanowire and the twelfth nanowire, and a length of the seventh nanowire in the first direction is smaller than a length of the ninth nanowire in the first direction.

4. The semiconductor device of claim 1, further comprising:

a third interface layer between the second gate electrode and the fourth nanowire, wherein a thickness of the third interface layer smaller than the second thickness of the second interface layer.

5. The semiconductor device of claim 4, wherein the first thickness of the first interface layer is same as the thickness of the third interface layer.

6. The semiconductor device of claim 1, further comprising:

a first gate insulation layer between the first gate electrode and the first interface layer; and a second gate insulation layer between the third gate electrode and the second interface layer.

7. The semiconductor device of claim 1, wherein a third length of the fifth nanowire in the first direction is smaller than the second length of the third nanowire in the first direction.

8. The semiconductor device of claim 7, wherein the third length of the fifth nanowire in the first direction is same as the first length of the first nanowire in the first direction.

9. The semiconductor device of claim 1, wherein the first thickness of the first interface layer is 0.2 nm to 2.0 nm, and the second thickness of the second interface layer is 2.5 nm to 4.5 nm.

10. The semiconductor device of claim 1, wherein the first length of the first nanowire in the first direction is 5 nm to 20 nm, and the second length of the third nanowire in the first direction is 30 nm to 300 nm.

11. A semiconductor device comprising:

a substrate including a first region, a second region, and a third region that are NMOS regions;

a first plurality of nanowires on the first region of the substrate, each extending in a first direction;

a second plurality of nanowires on the second region of the substrate, each extending in the first direction;

a third plurality of nanowires on the third region of the substrate, each extending in the first direction;

a first gate electrode surrounding the first plurality of nanowires and extending in a second direction different from the first direction;

a second gate electrode surrounding the second plurality of nanowires and extending in the second direction;

a third gate electrode surrounding the third plurality of nanowires and extending in the second direction;

a first interface layer between the first gate electrode and the first plurality of nanowires, the first interface layer having a first thickness, the first interface layer being in contact with each of an upper face and a bottom face of the first plurality of nanowires;

a second interface layer between the third gate electrode and the third plurality of nanowires, the second interface layer having a second thickness greater than the first thickness, the second interface layer being in contact with each of an upper face and a bottom face of the third plurality of nanowires;

a first gate insulation layer between the first gate electrode and the first interface layer;

a second gate insulation layer between the third gate electrode and the second interface layer; and a first internal spacer on a side wall of at least one of the first gate electrode, the second gate electrode, and the third gate electrode, a first length of the first plurality of nanowires in the first direction being smaller than a second length of the second plurality of nanowires in the first direction, wherein a thickness of a top region of the first gate electrode over the first plurality of nanowires is thicker than regions of the first gate electrode respectively between the first plurality of nanowires, and wherein the first internal spacer is on one sidewall selected from the sidewall of the first gate electrode, the sidewall of the second gate electrode, and the sidewall of the third gate electrode, provided that the first internal spacer is not on two different sidewalls selected from the sidewall of the first gate electrode, the sidewall of the second gate electrode, and the sidewall of the third gate electrode, or the first internal spacer is on two sidewalls selected from the sidewall of the first gate electrode, the sidewall of the second gate electrode, and the sidewall of the third gate electrode, provided that the first internal spacer is not on one different sidewall selected from the sidewall of the first gate electrode, the sidewall of the second gate electrode, and the sidewall of the third gate electrode.

12. The semiconductor device of claim 11, further comprising:

a fourth plurality of nanowires on a fourth region of the substrate and extending in the first direction;

a fifth plurality of nanowires on a fifth region of the substrate and extending in the first direction;

a sixth plurality of nanowires on a sixth region of the substrate and extending in the first direction;

a fourth gate electrode surrounding the fourth plurality of nanowires and extending in the second direction;

a fifth gate electrode surrounding the fifth plurality of nanowires and extending in the second direction;

a sixth gate electrode surrounding the sixth plurality of nanowires and extending in the second direction;

a third interface layer between the fourth gate electrode and the fourth plurality of nanowires, the third interface layer having a third thickness;

a fourth interface layer between the sixth gate electrode and the sixth plurality of nanowires, the fourth interface layer having a fourth thickness greater than the third thickness;

a third gate insulation layer between the fourth gate electrode and the third interface layer;

a fourth gate insulation layer between the sixth gate electrode and the fourth interface layer; and a second internal spacer at least one of between the fourth plurality of nanowires, between the fifth plurality of nanowires, and between the sixth plurality of nanowires, wherein the fourth region, the fifth region, and the sixth region each are a PMOS region in the substrate, and a length of the fourth plurality of nanowires in the first direction is smaller than a length of the fifth plurality of nanowires in the first direction.

13. The semiconductor device of claim 11, further comprising:

a third interface layer between the second gate electrode and the second plurality of nanowires, wherein a thickness of the third interface layer is smaller than the second thickness of the second interface layer.

14. The semiconductor device of claim 11, wherein a third length of the third plurality of nanowires in the first direction is smaller than the second length of the second plurality of nanowires in the first direction.

15. The semiconductor device of claim 11, wherein a width of the first gate electrode in the first direction is smaller than a width of the second gate electrode in the first direction.

* * * * *